(12) United States Patent
Watanabe

(10) Patent No.: US 9,966,467 B2
(45) Date of Patent: May 8, 2018

(54) INTEGRATED CIRCUIT AND CODE GENERATING METHOD

(71) Applicant: PHISON ELECTRONICS CORP., Miaoli (TW)

(72) Inventor: Hiroshi Watanabe, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 924 days.

(21) Appl. No.: 14/038,772

(22) Filed: Sep. 27, 2013

(65) Prior Publication Data

US 2015/0091747 A1    Apr. 2, 2015

(51) Int. Cl.
| | | |
|---|---|---|
| H01L 25/00 | (2006.01) |
| H01L 29/78 | (2006.01) |
| B82Y 10/00 | (2011.01) |
| B82Y 40/00 | (2011.01) |
| H01L 29/423 | (2006.01) |
| H01L 29/66 | (2006.01) |
| H01L 29/775 | (2006.01) |
| H01L 29/06 | (2006.01) |

(Continued)

(52) U.S. Cl.
CPC ............ *H01L 29/785* (2013.01); *B82Y 10/00* (2013.01); *B82Y 40/00* (2013.01); *H01L 29/0673* (2013.01); *H01L 29/0676* (2013.01); *H01L 29/42376* (2013.01); *H01L 29/42392* (2013.01); *H01L 29/66439* (2013.01); *H01L 29/775* (2013.01); *H01L 29/78696* (2013.01); *H03K 3/84* (2013.01)

(58) Field of Classification Search
CPC ...................................................... G08C 19/28
USPC .............................. 327/564; 507/401; 380/46
See application file for complete search history.

(56) References Cited

U.S. PATENT DOCUMENTS 6,451,630 B2 *   9/2002   Lee ..................... H01L 27/1214
                                                          257/344
7,192,811 B2 *   3/2007   Yang ................. H01L 27/11253
                                                          257/209

(Continued)

FOREIGN PATENT DOCUMENTS

CN          101958147         1/2011

OTHER PUBLICATIONS

"Office Action of Taiwan Counterpart Application", dated Jun. 26, 2015, p. 1-p. 4.

(Continued)

*Primary Examiner* — Lincoln Donovan
*Assistant Examiner* — Metasebia Retebo
(74) *Attorney, Agent, or Firm* — JCIPRNET

(57) ABSTRACT

An integrated circuit and a code generating method are described. The integrated circuit includes a plurality of field effect transistors, a plurality of sense-amplifiers, and a processing circuit. Each field effect transistor is configured to represent an address in a mapping table and includes a source, a drain, a channel and a gate. Each sense-amplifier is connected to the drain and configured to sense an electric current from the drain and identify a threshold voltage of the corresponding field effect transistor. The processing circuit is configured to categorize each of the threshold voltages identified by the corresponding sense-amplifiers into a first state and a second state and mark the state of each of the threshold voltages at the corresponding address in the mapping table.

10 Claims, 31 Drawing Sheets

(51) Int. Cl.
H01L 29/786 (2006.01)
H03K 3/84 (2006.01)

(56) References Cited

U.S. PATENT DOCUMENTS

| | | | |
|---|---|---|---|
| 2008/0013359 A1* | 1/2008 | Fisch | G11C 7/12 |
| | | | 365/72 |
| 2011/0317829 A1 | 12/2011 | Ficke et al. | |
| 2013/0106461 A1 | 5/2013 | Ficke et al. | |
| 2014/0264575 A1* | 9/2014 | Tsai | H01L 29/66492 |
| | | | 257/336 |
| 2015/0035062 A1* | 2/2015 | Liu | H01L 29/66795 |
| | | | 257/368 |

OTHER PUBLICATIONS

Simmons, A System for Verifying User Identity and Authorization at the Point-Of Sale or Access, Cryptologia, Jan. 1984, pp. 1-21, vol. 8. No. 1.

Simmons, "Identification of Data, Devices, Documents and Individuals," Proceedings of 25th Annual 1991 IEEE International Carnahan Conference on Security Technology, Oct. 1-3, 1991, pp. 197-218.

Rappu et al., "Physical One-Way Functions," Science, Sep. 20, 2002, pp. 2026-2030, vol. 297.

Skoric et al., "Information-theoretic analysis of capacitive physical unclonable functions," Journal of Applied Physics, Jul. 17, 2006, pp. 024902, vol. 100.

Tuyls wt al., "Read-Proof Hardware from Protective Coatings," CHES 2006 Proceedings of the 8th international conference on Cryptographic Hardware and Embedded Systems, Oct. 10, 2006, pp. 369-383.

Gassend, "Physical Random Functions," Masters Thesis in Electrical Engineering and Computer Science of Massachusetts Institute of Technology, Feb. 2003, pp. 1-89.

Lim et al., "Extracting Secret Keys From Integrated Circuits," IEEE Transactions on Very Large Scale Integration (VLSI) Systems, Oct. 2005, pp. 1200-1205, vol. 13, No. 10.

Asenov, "Random Dopant Induced Threshold Voltage Lowering and Fluctuations in Sub-0.1µm MOSFET's: A 3-D "Atomistic" Simulation Study," IEEE Transactions on Electron Devices, Dec. 1998, pp. 2505-2513, vol. 45, No. 12.

Hung et al., "Random Telegraph Noise of Deep-Submicrometer MOSFET's," IEEE Electron Device Letters, Feb. 1990, pp. 90-92, vol. 11, No. 2.

Kurata et al., "The Impact of Random Telegraph Signals on the Scaling of Multilevel Flash Memories," 2006 Symposium on VLSI Circuits Digest of Technical Papers, Jun. 15-17, 2006, pp. 112-113.

Lue et al., "A Highly Scalable 8-Layer 3D Vertical-Gate (VG) TFT NAND Flash Using Junction-Free Buried Channel BE-SONOS Device," 2010 Symposium on VLSI Technology Digest of Technical Papers, Jun. 15-17, 2010, pp. 131-132.

Tanaka et al., "Bit Cost Scalable Technology with Punch and Plug Process for Ultra High Density Flash Memory," 2007 Symposium on VLSI Technology Digest of Technical Papers, Jun. 12-14, 2007, pp. 14-15.

\* cited by examiner

Address on cross-mapping

| 1 | 2 | 3 | 4 | 5 | 6 | ... | ... | ... | ... |
|---|---|---|---|---|---|---|---|---|---|
| ... | ... | ... | ... | ... | ... | ... | ... | ... | ... |
|   |   |   |   |   |   |   |   |   |   |
|   |   |   |   |   |   |   |   |   |   |
|   |   |   |   |   |   |   |   |   |   |
|   |   |   |   |   |   |   |   |   |   |
|   |   |   |   |   |   |   |   |   |   |
|   |   |   |   |   |   |   |   |   |   |
| ... | ... | ... | ... | ... | ... | ... | ... | ... | ... |
| ... | ... | ... | ... | 2N−5 | 2N−4 | 2N−3 | 2N−2 | 2N−1 | 2N |

Chip Tricolor code

| G | G | R | G | B | G | R | B | B | R |
|---|---|---|---|---|---|---|---|---|---|
| R | G | G | G | R | R | G | B | G | G |
| B | R | B | G | R | B | G | R | G | G |
| G | B | G | G | G | B | R | B | G | G |
| G | R | G | G | G | R | G | G | R | R |
| G | G | R | R | B | B | G | B | B | G |
| R | B | G | R | R | B | G | R | R | B |
| R | B | G | R | G | G | B | G | R | G |
| G | R | G | G | B | R | R | G | G | R |
| G | R | B | B | G | B | B | G | R | G |

FIG. 41

INTEGRATED CIRCUIT AND CODE GENERATING METHOD

BACKGROUND

Field of the Invention

The invention relates generally to an integrated circuit and a code generating method.

Description of Related Art

Encryption and authentication technologies have been crucially required to make sure the security of the network, as the network has been prevailing since the mid of the last century. Most of these technologies have been designed by assuming that they are used in a server or PC which has powerful computational ability. For example, anti-virus software and random-number generating software need powerful computation to work. In recent years, on the other hand, there have been increasing chances of small equipment which have less computational power can be connected to the network, such as SIM-card, sensors, smart-meters, smart-cards, USB memories, and so on. The network composed of small equipment like these causes the birth of new application service with the usage of cloud-computing, social network, smart-grid, machine-to-machine (M2M) network, and so on. Since an LSI chip is a component of the small equipment, the number of the chips used in the network must be substantially increased. Thus, some new technology is required to be embedded into LSI chips, in order to make sure the security of the network composed of LSI chips each of which has less computational power. As a result, it is anticipated that the device-level module must be demanded for encryption and authentication. It is also noted that the cost of the security module in the chip is a significant factor.

Generally, a device level module for security includes a) a circuit to carry out the operation of encryption and authentication, and b) a circuit to save/maintain the confidential information that is necessary to operate encryption and authentication (key-maintenance).

It should be noted that the $2^{nd}$ part (key-maintenance) is added to the chip, which increases the cost of the chip. It is also noted that the attacker will possibly attack the key-maintenance. An example of key-maintenance is illustrated in FIG. 1.

(Physically-Unclonable Function)

In recent years, as illustrated in FIG. 2, it is expected that the key-maintenance circuit will be replaced by a physically unclonable function (PUF), in which an individual difference of chip is used to identify the chip. For example, the module of PUF will return an output (R) with respect to an input (C) as shown in FIG. 3. Another chip will return another output with respect to the same input, as shown in FIG. 4. One can identify a chip with the output difference among chips with respect to the same input. In other words, PUF will create the ID as necessary and it is not necessary to store the ID in the memory.

(Utilization of PUF)

(Authenticity) As long as the output (R) from a chip is different from any other chip, this output can be regarded as an ID number of chip, as shown in FIG. 4.

(Copy Protect) It is possible to create a common encryption key (Key-A) from the output (R-A) of a chip-A. It is also possible to create a common encryption key (Key-B) from the output (R-B) of a chip-B. As shown in FIG. 4, Key-B must be different from Key-A with respect to the same input (C). Once a program is encrypted with Key-A, the program cannot be executed with any other LSI (LSI-B) because Key-B is different from Key-A.

(Requirement for PUF)

a) (Unpredictability) It is impossible or very hard to predict a combination of input (C1) and output (R1) from other combinations of input-output, (C2)-(R2), (C3)-(R3) . . . with regard to a chip. In FIG. 5, it is assumed that the combinations of (C1)-(R1), (C2)-(R3) . . . (Cn)-(Rn) are known. In this event, it must be impossible or very hard to predict a combination of (Cn+1)-(Rn+1).

b) (Originality) Any two chips must return different returns (R1 and R2, where R1≠R2) with respect to the same input (C), as shown in FIG. 4.

c) (Reproducibility) Noise causes, in general, the output from a device to fluctuate around a mean value (R). The fluctuation (ΔR) must be smaller than the difference between any two outputs ($|\Delta R|<|R_l-R_m|$ for $\forall l$ and $\forall m$), as shown in FIG. 6.

(Merits of PUF)

a) (Invisible label) The return from PUF can be regarded as an invisible label that is randomly and independently attached to each LSI chip without any additional design. It is useful to distinguish certificated or not, as shown in FIG. 7. It is noted that the return from PUF is not necessary to be saved in memory; which means "invisible".

b) (Copy Protect) An encryption key can be created from the return from PUF. Once a program is encrypted with a key created by PUF in a chip, it cannot be executed with any other chip as long as PUF appropriately operates, as shown in FIG. 8.

However, nothing herein should be construed as an admission of knowledge in the prior art of any portion of the invention. Furthermore, citation or identification of any document in this application is not an admission that such document is available as prior art to the invention, or that any reference forms a part of the common general knowledge in the art.

SUMMARY OF THE DISCLOSURE

Accordingly, the invention is directed to integrated circuits and code generating methods capable of physically unclonable identification of a chip within standard CMOS technologies.

According to an exemplary embodiment, an integrated circuit is provided. The integrated circuit includes at least one first input/output end, at least one current path connected with the first input/output end, at least one control end disposed above the at least one current path and configured to apply a plurality of control end voltages on the at least one current path, and at least one second input/output end connected with the current path. Moreover, the width and the thickness of the current path are defined according to the de Broglie length (DBL), and the length of the current path is longer than the width and the thickness of the current path.

According to an exemplary embodiment, another integrated circuit is provided. The integrated circuit includes a plurality of semiconductor cells, a plurality of sense-amplifiers, and a processing circuit. Each semiconductor cell is configured to represent an address in a mapping table and includes a first input/output end, a second input/output end, a current path and a control end. Each sense-amplifier is connected to the second input/output end and configured to sense an electric current from the second input/output end and identify a threshold voltage of the corresponding semiconductor cell. The processing circuit is configured to categorize each of the threshold voltages identified by the corresponding sense-amplifiers into a first state and a second state and mark the state of each of the threshold voltages at the corresponding address in the mapping table.

According to an exemplary embodiment, a code generating method is provided. The code generating method is adopted in an integrated circuit having a plurality semiconductor cells, each of the cells comprising a first input/output end, a second input/output end and a current path, in which the width and the thickness of the current path are defined according to the de Broglie length (DBL), and at least one dopant ion is randomly doped in the current path of the semiconductor cells. The method includes: configuring each semiconductor cell to represent an address in a mapping table; determining a read voltage and a reference current; sensing an electric current from the second input/output end and identifying a threshold voltage of the corresponding semiconductor cell; categorizing each of the identified threshold voltages into a first state and a second state; and marking each semiconductor cell at the corresponding address of the mapping table according to the state of the threshold voltages.

According to an exemplary embodiment, the step of categorizing each of the identified threshold voltages into the first state and the second state further includes: categorizing each of the threshold voltages into the first state, the second state, and a third state.

In summary, the integrated circuits and code generating methods described in the embodiments of the invention can generate physically unclonable identification of a chip within standard CMOS technologies.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned features and advantages of the present invention more comprehensible, embodiments accompanying figures are described in detail below.

BRIEF DESCRIPTION OF THE DRAWINGS

FIG. 41 illustrates a RGB checker board pattern showing a 2D mapping table of a Vt distribution in which R, G and B represent different Vt ranges as shown in FIG. 36 according to another embodiment of the invention.

DESCRIPTION OF EMBODIMENTS

Figure 1:
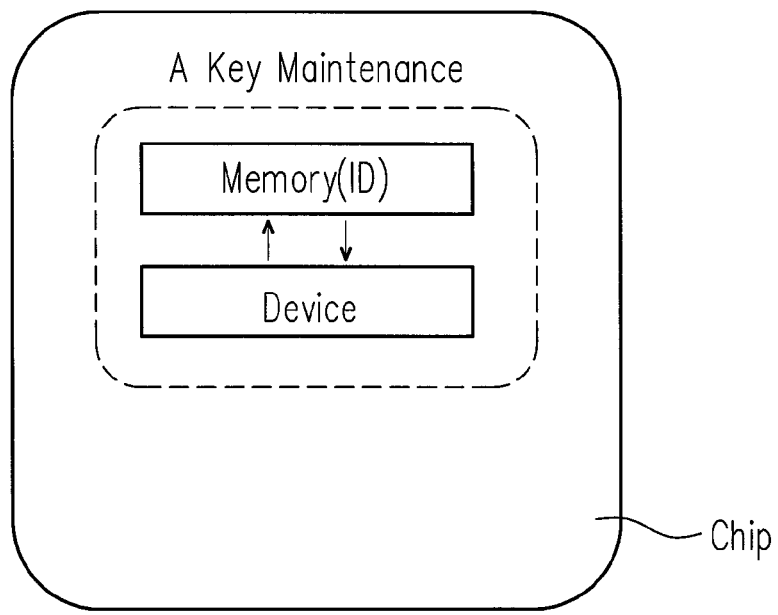
FIG. 1 illustrates an example of a key-maintenance module without PUF in the prior art.
Figure 2:
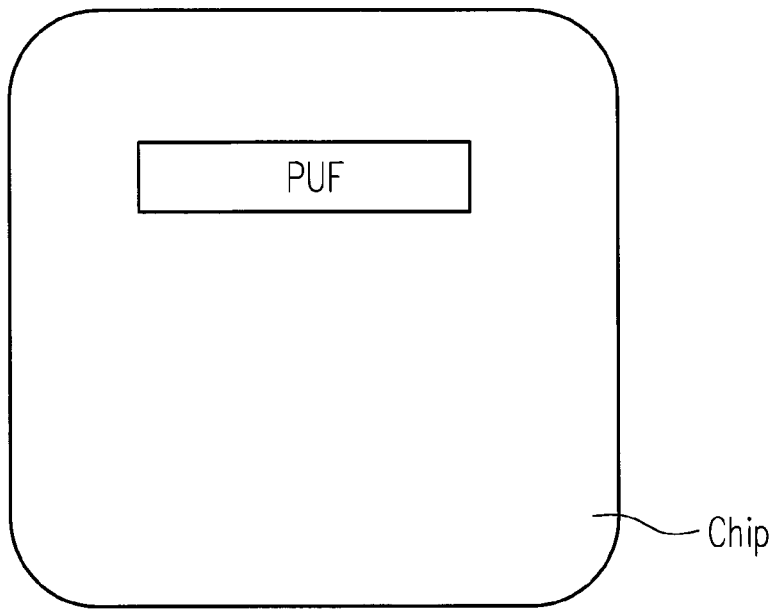
FIG. 2 illustrates a chip with PUF embedded.
Figure 3:
FIG. 3 illustrates the concept of PUF.
Figure 4:
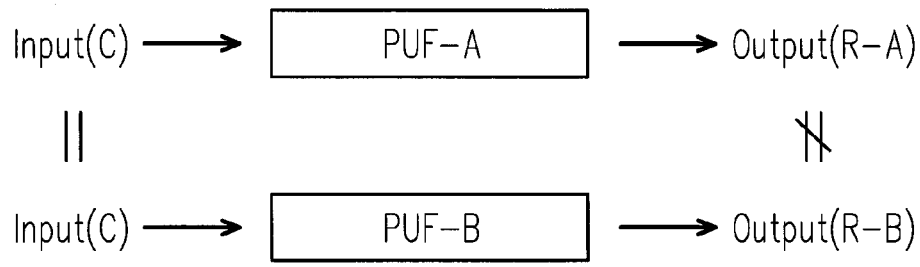
FIGS. 4, 5 and 6 respectively illustrate the originality, the unpredictability and the reproducibility of PUF.
Figure 5:
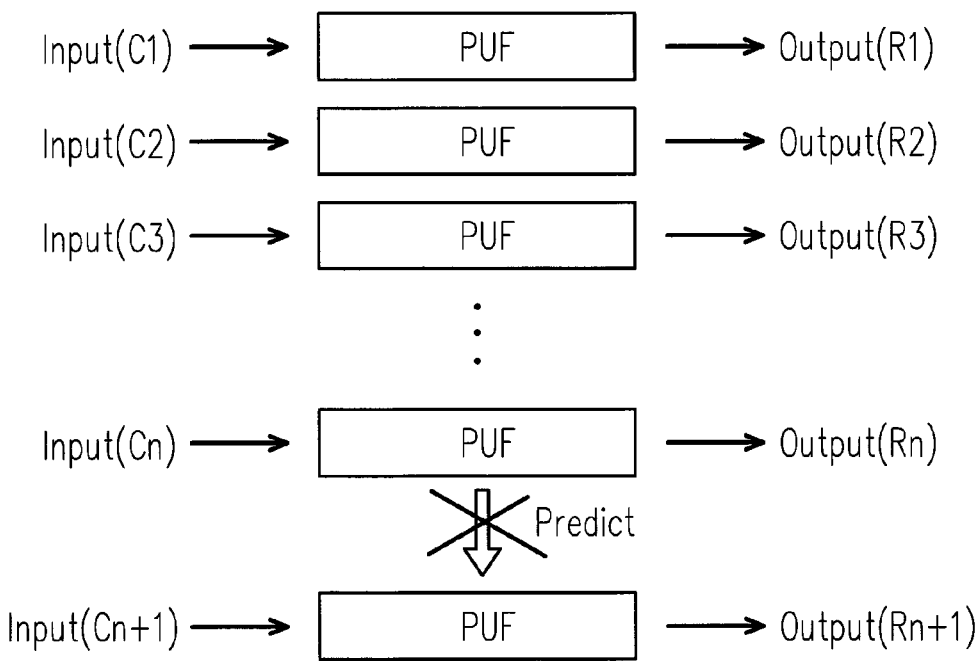
Figure 6:
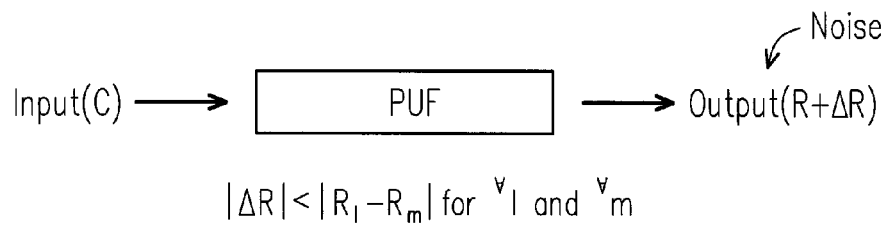
Figure 7:
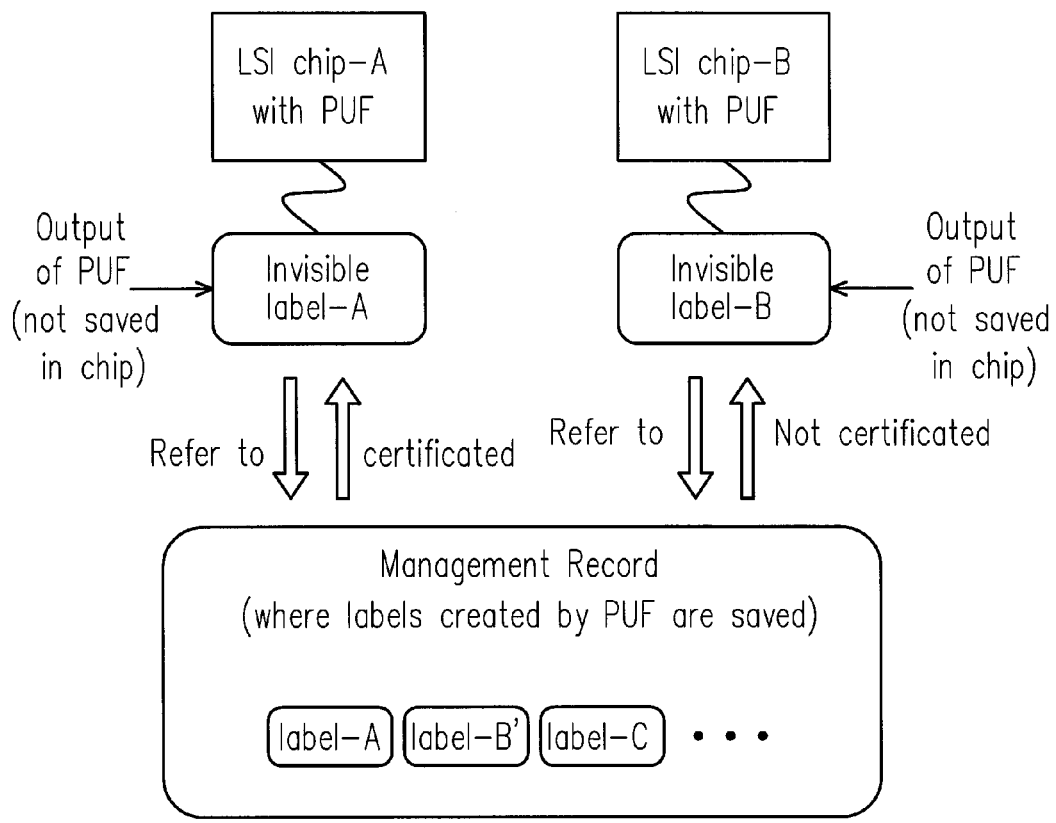
FIG. 7 illustrates a management of a chip with PUF.
Figure 8:
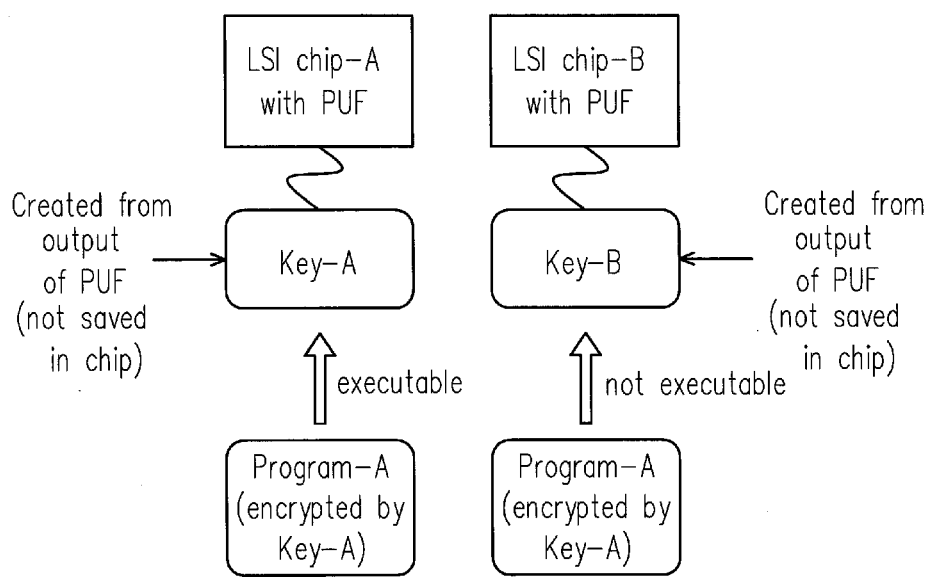
FIG. 8 illustrates a copy protect effect achieved by PUF.

Reference now is made to the accompanying drawings to describe the specific embodiments and examples of the invention. Whenever possible, the same reference characters are used in the drawings and the description to refer to the same or like parts.

(Random-Dopant Fluctuation, RDF)

In the disclosure below, utilizing the random-dopant fluctuation (RDF) for the physically-unclonable function is explained. It has to be noted here that in the following exemplary embodiments, field effect transistors are used as examples to explain the idea of the present invention, and thus a first input/output end may represent a source, a second input/output end may represent a drain, a current path may represent a channel, and a control end may represent a gate; however, the aforementioned embodiments are only used as exemplary examples but not tend to limit the scope of the present invention. In fact, the present invention could also be realized on several other semiconductor devices which are CMOS compatible, such as a bipolar junction transistor (BJT).

In order to make the Vt change by ions notable compared to conventional techniques, the channel width W may be shrunk, while the channel length L may not be shrunk. The typical length of W is comparative to the de Broglie length (DBL), which is typically about 9 nm in silicon materials, while the typical length of L is much larger than DBL, for example, more than 100 nm.

Figure 9:
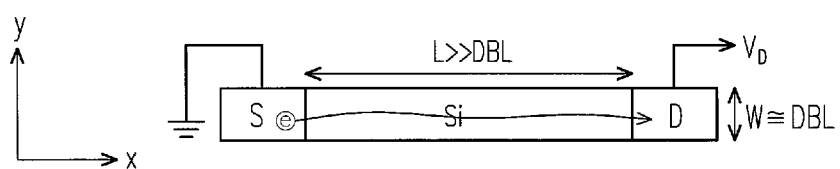
FIG. 9 illustrates a Fin transistor with a channel width W around the DBL according to an exemplary embodiment.

Several cases where the channel width W is about DBL are discussed below. As illustrated in FIG. 9, the electron current flows from the source to the drain across the channel with no ions.

Figure 10:
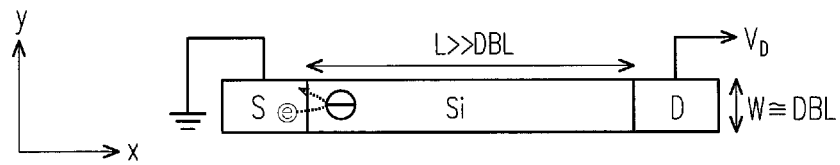
FIG. 10 illustrates a conduction state of the Fin transistor of FIG. 9 when a negative ion is present at the source-channel interface according to an exemplary embodiment.

If a negative ion is present at the source-channel interface, as illustrated in FIG. 10, electrons are reflected by the peak potential of the negative ion. No current flows, because electrons cannot skirt the ion owing to the narrow channel (Si).

As mentioned above, the threshold voltage (Vt) is notably affected only when the ion is located at the interface between the source and the drain at the surface of Sub. This feature is made notable by the cell structure proposed in the invention, in which the channel length is larger than the DBL and the channel width is about DBL.

First Embodiment

Figure 11:
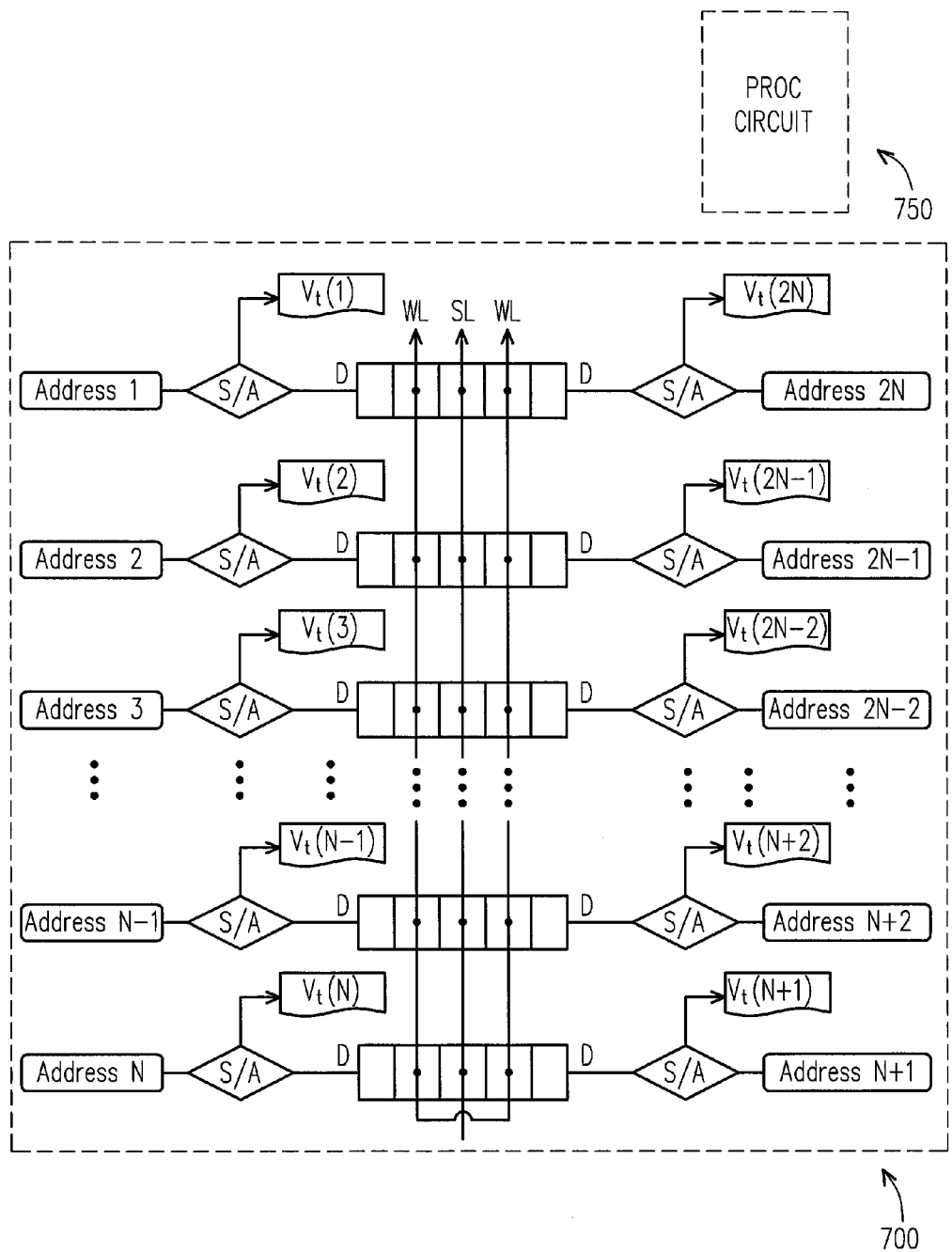
FIG. 11 illustrates the structure of an integrated circuit according to a first embodiment of the invention.

FIG. 11 illustrates an integrated circuit according to a first exemplary embodiment of the invention. In FIG. 11, an integrated circuit 700 includes a plurality of field effect transistors and a plurality of sense amplifiers, in which each field effect transistor is configured to represent an address in a mapping table and includes a source, a drain, a channel and a gate. In some exemplary embodiments, in order to minimize source contact as much as possible, a source is shared by two cells and all the sources are connected to a common source line (SL), as shown in FIG. 11. Two drains (D) of tandem cells (by which the sources are shared) are independently connected to the sense-amplifiers (S/A). Each of the sense-amplifiers S/A is allocated to the address data (Address 1, Address 2, Address 3 . . . , and Address 2N) in this example. The number of cells is 2N and the number of tandem cells is N. These sense-amplifiers S/A sense the threshold voltage of each cell, i.e., Vt(1), Vt(2), Vt(3), . . . , and Vt(2N). All of the gates are connected to a common word line (WL). In some embodiments, the integrated circuit 700 may also include a processing circuit 750 configured to categorize each of the threshold voltages Vt(1), Vt(2), Vt(3), . . . , and Vt(2N) identified by the corresponding sense-amplifiers S/A into a first state and a second state, and to mark the state of each of the threshold voltages Vt(1), Vt(2), Vt(3), . . . , and Vt(2N) at the corresponding address in the mapping table (e.g., the checker board shown in FIG. 13 or FIG. 16). However, it should be noted that the processing circuit 750 is not limited to categorizing the threshold voltages into two states, and the processing circuit 750 may also categorize the threshold voltages into three states, for example, depending on the application.

Figure 12:
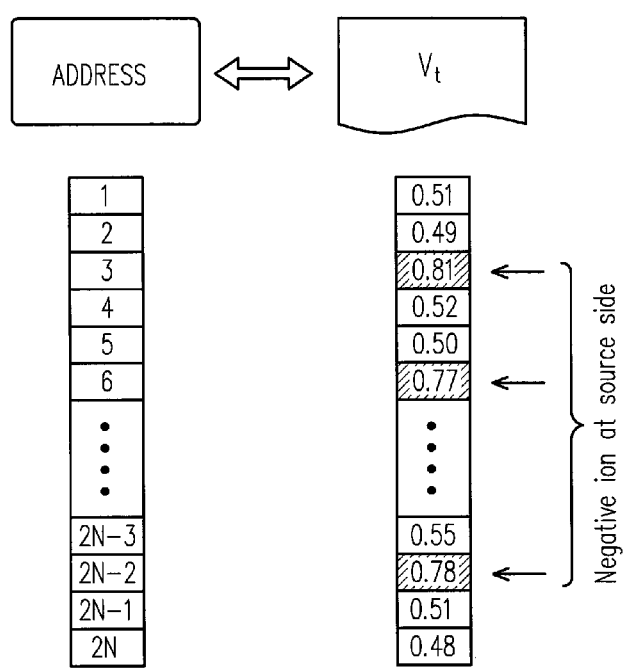
FIG. 12 illustrates the relationship between the address data and the sensed Vt values of corresponding cells in an example of the invention, in which the Vt fluctuation owing to the random-dopant fluctuation is shown.

FIG. 12 shows the address data in the left and the sensed threshold voltages of the corresponding cells in the right. In this example, n-type MOSFET (p-type channel) is assumed. There are fluctuated threshold voltages around 0.5 V and 0.8 V. This discrepancy comes from a negative ion which exists around source edge at the surface of the silicon substrate. It is regarded that 0.5 V corresponds to the case where a negative ion doesn't exist around the source edge at the surface of the silicon substrate while 0.8V corresponds to the case where a negative ion exists around the source edge at the surface of the silicon substrate.

Figures 13, 14:
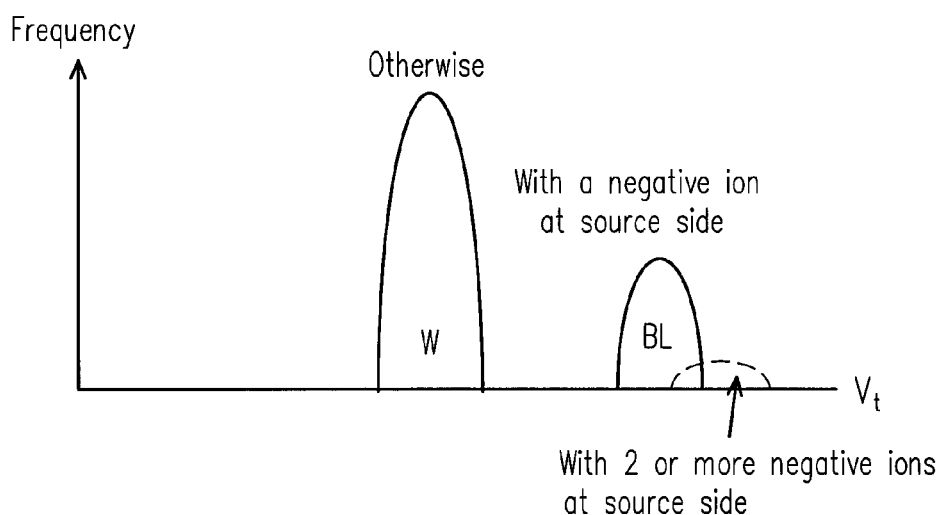
FIG. 13 illustrates the addressing on a two-dimensional (2D) plane area, in which Address 1, Address 2 . . . and Address 2N are arranged in a mapping table having a checker board pattern according to an exemplary embodiment.
FIG. 14 illustrates the distribution of the sensed Vt values of the cells in a case where negative ions are doped in random according to an exemplary embodiment.

FIG. 13 illustrates the addressing on a two-dimensional plane area (i.e., the mapping table), in which Address 1, Address 2 . . . and Address 2N are mapped in a checker board pattern.

FIG. 14 illustrates a distribution of the sensed threshold voltages. The right peak corresponds to the case where the negative ion exists around the source edge at the surface of the silicon substrate. The tail having the higher Vt comes from a second or more negative ions that exist around the source edge at the surface of the silicon substrate. The other peak corresponds to the case where the negative ion doesn't exist around the source edge at the surface of the silicon substrate. The cells belonging to the right peak are depicted black (BL) on the checker board, while the other cells are depicted white (W) on the checker board.

Figure 16:
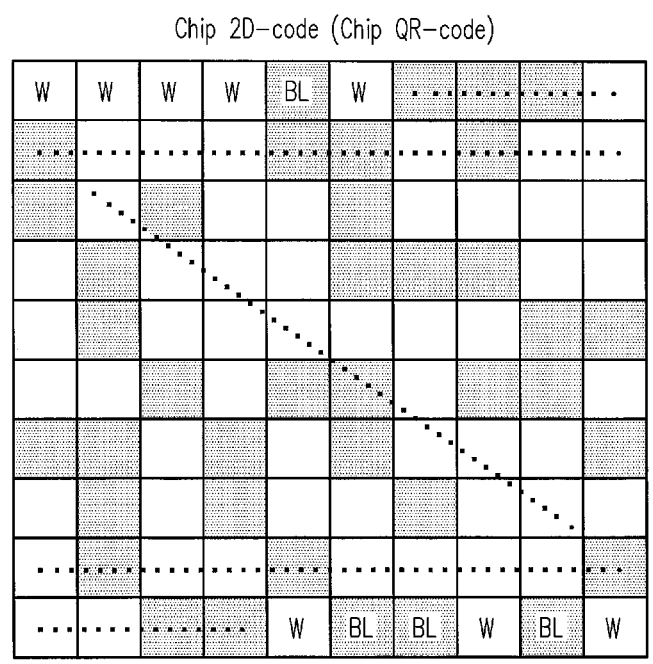
FIG. 16 illustrates an example of the distribution of black and white on the checker board pattern representing the Vt distribution of the cells according to an exemplary embodiment.

FIG. 16 illustrates an example of the distribution of black and white on the checker board pattern. The black and white arrangement on the checker board pattern (i.e., the mapping table) is determined by the distribution of the sensed threshold voltages. Since the location of negative ions in device fluctuates among cells, the checker board pattern fluctuates with respect to random-dopant fluctuation.

Figure 15:
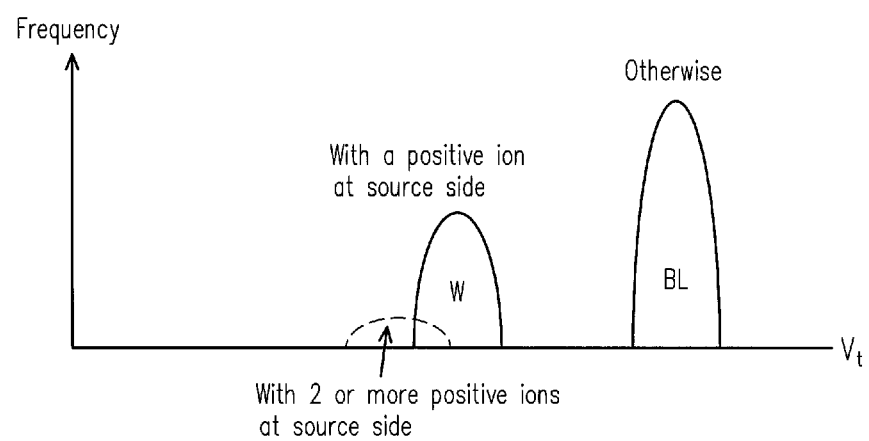
FIG. 15 illustrates the distribution of the sensed Vt values of the cells in a case where positive ions are doped in random according to an exemplary embodiment.

In this embodiment, the negative ion can be replaced with a positive ion. Even in this event, the right peak is black (BL) and the other one is white (W), as illustrated in FIG. 15. The following embodiments are essentially unchanged, as long as the black-white checker board pattern (illustrated in FIG. 16) is formed by the random-dopant fluctuation (RDF) in a similar manner.

It is also possible to replace the n-type FET (p-channel) with a p-type FET (n-channel). Here "FET" means "field effect transistor". Even in this event, the right peak is black (BL) and the other is white (W), as illustrated in FIG. 16. The following embodiments are essentially unchanged, as long as the black-white checker board pattern (FIG. 16) is made by random-dopant fluctuation (RDF) in a similar manner.

Second Embodiment: Device Structure

Figure 17:
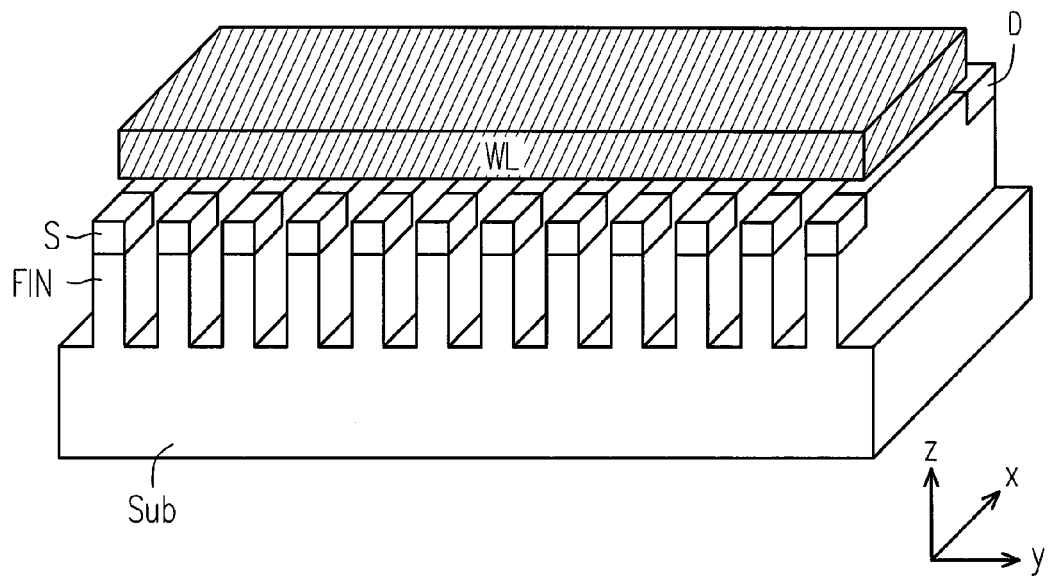
FIG. 17 illustrates an exemplary device structure according to a second embodiment of the invention, which has a common word line (WL) as a sole gate.

FIG. 17 is a device structure according to the second exemplary embodiment of the invention. There is a plurality of Fin-FETs connected to a common word line (WL). The shape of the WL is a plate shape. Each Fin-FET may satisfy the condition that channel width (W) is around 10 nm, i.e., the de Broglie length (DBL) and the channel length (L) is much larger than 10 nm. Note that the word lines may be independent in a usual system of Fin-FET. There is a gate insulating film between WL and the channel.

Third Embodiment: Tri-Gate Type

Figure 18:
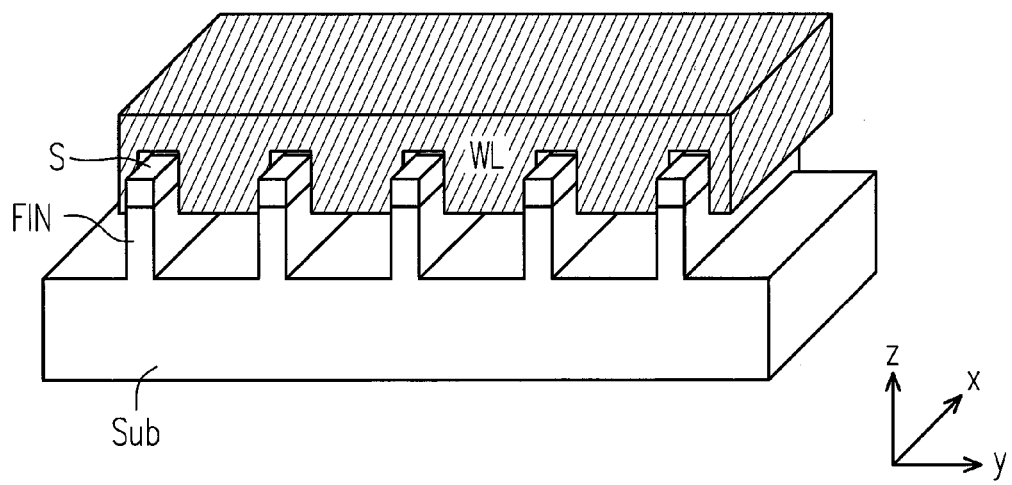
FIG. 18 illustrates another exemplary device structure according to the third embodiment of the invention, which has a common WL wrapping the Fins to form a plurality of tri-gate cells.

FIG. 18 is another device structure according to a third exemplary embodiment of the invention. There is a plurality of Fin-FETs connected to a common gate. The WL wraps the Fins as shown so that the device structure is a tri-gate. Each Fin-FET may satisfy the condition that channel width (W) is around 10 nm, i.e., the de Broglie Length (DBL) and the channel length (L) is much larger than 10 nm. The gate insulating film also surrounds the Fin layers and is surrounded by the word line (WL). Note that word lines may be independent in a typical Fin-FET system.

Fourth Embodiment: Measure Random-Telegraph Noise

Figure 19:
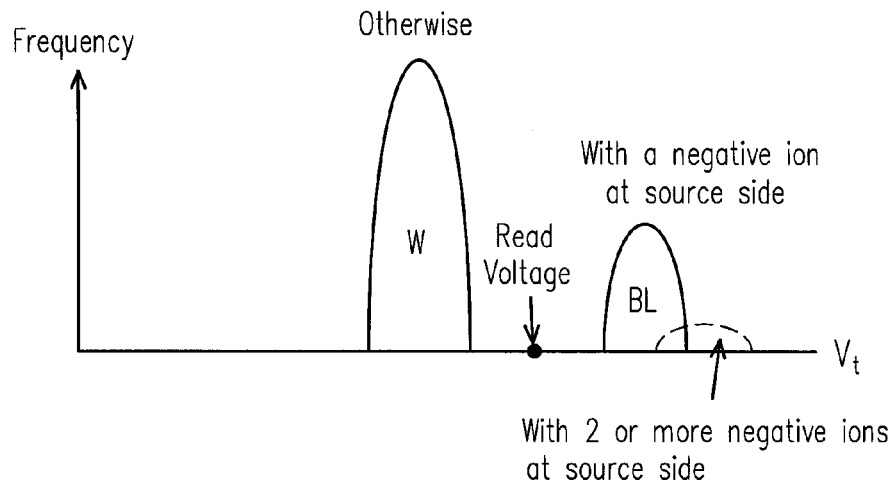
FIG. 19 illustrates the relationship between the read voltage and the lower-Vt peak (W) and the higher-Vt peak (BL) in the Vt distribution according to an exemplary embodiment.

Each of the sense-amplifiers S/A in FIG. 11 reads the threshold voltage (Vt) of the corresponding cell as shown in FIG. 11. The 2N cells and the 2N sense-amplifiers S/A are grouped with a common word line (WL), as shown in FIGS. 12, 18 and 19, and also with a common source-line (SL), as shown in FIG. 11. The sensed threshold voltages of the cells in the group are labeled Vt(1), Vt(2), . . . , Vt(2N), wherein each Vt(n) corresponds to Address n, as shown in FIG. 11, where n is from 1 to 2N. This corresponding relationship is shown in FIG. 12, and the distribution of threshold voltages is divided into two peaks; i.e., the higher-Vt peak (Black, BL) and the lower-Vt peak (White, W), as shown in FIG. 14. If the address shown in FIGS. 11 and 12 is mapped onto a 2D area, as illustrated in FIG. 13, a white-black checker board pattern is obtained with respect to the random-dopant fluctuation, as illustrated in FIG. 16.

To read the threshold voltage, the read voltage is applied by the common word line (WL) shown in FIGS. 11, 17 and 18. This read voltage may be higher than the higher tail of the lower Vt peak (W) and lower than the lower tail of the higher Vt peak (BL) in the Vt distribution, as illustrated in FIG. 19.

Figure 20:
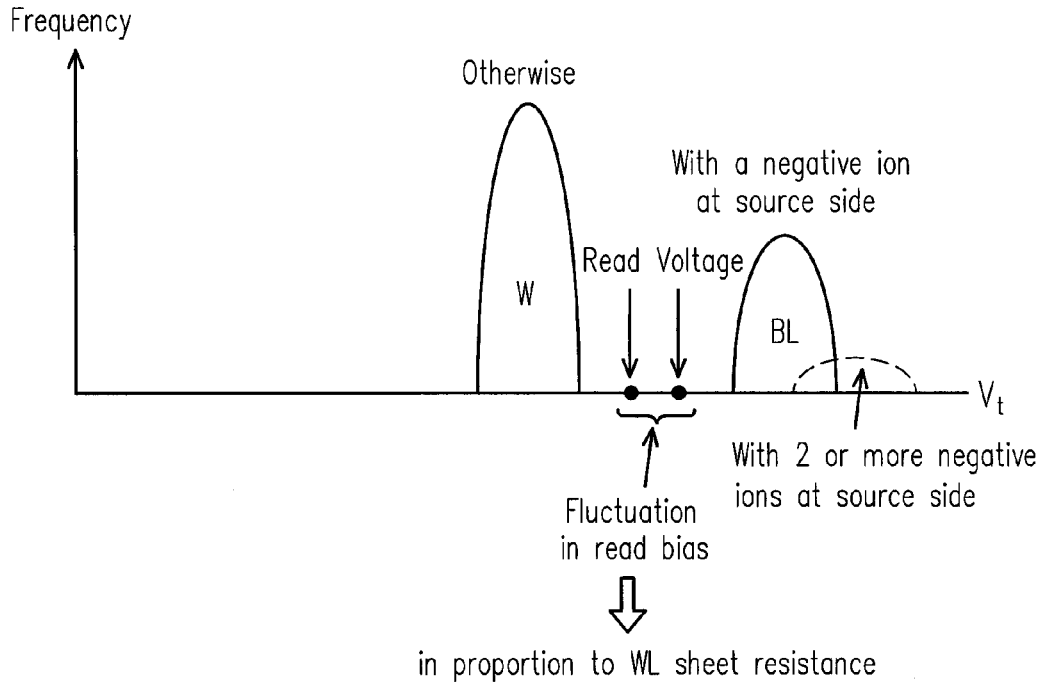
FIG. 20 illustrates the relationship between a read voltage with fluctuation, the lower-Vt peak (W), and the higher-Vt peak (BL) according to a fourth embodiment of the invention.

Owing to the fluctuation of the word-line shift resistance, it may be necessary to take care of the fluctuation of the read voltage, as illustrated in FIG. 20. However, in the exemplary embodiment of the invention, the word line is a common word line (WL) as shown in FIGS. 11, 17 and 18, and the shift resistance is very small.

Figure 21:
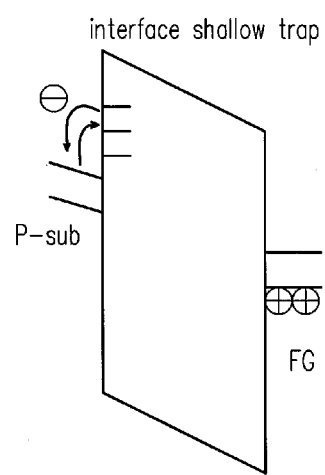
FIG. 21 illustrates the cause of the random-telegraph noise (RTN) according to an exemplary embodiment.

A more important sensing issue is the random-telegraph noise (RTN) as described following, which is schematically illustrated in FIG. 21. If there are interface shallow traps, electrons are repeatedly trapped by these traps or emitted from these traps. This trap-detrap phenomenon quickly and randomly occurs, and thereby the sensed threshold voltage is fluctuated. The fluctuation amplitude is detectable (about 200 mV) but much smaller than threshold voltage shift which is attributable to ion existing at source side in this exemplary embodiment of the invention.

Figure 22:
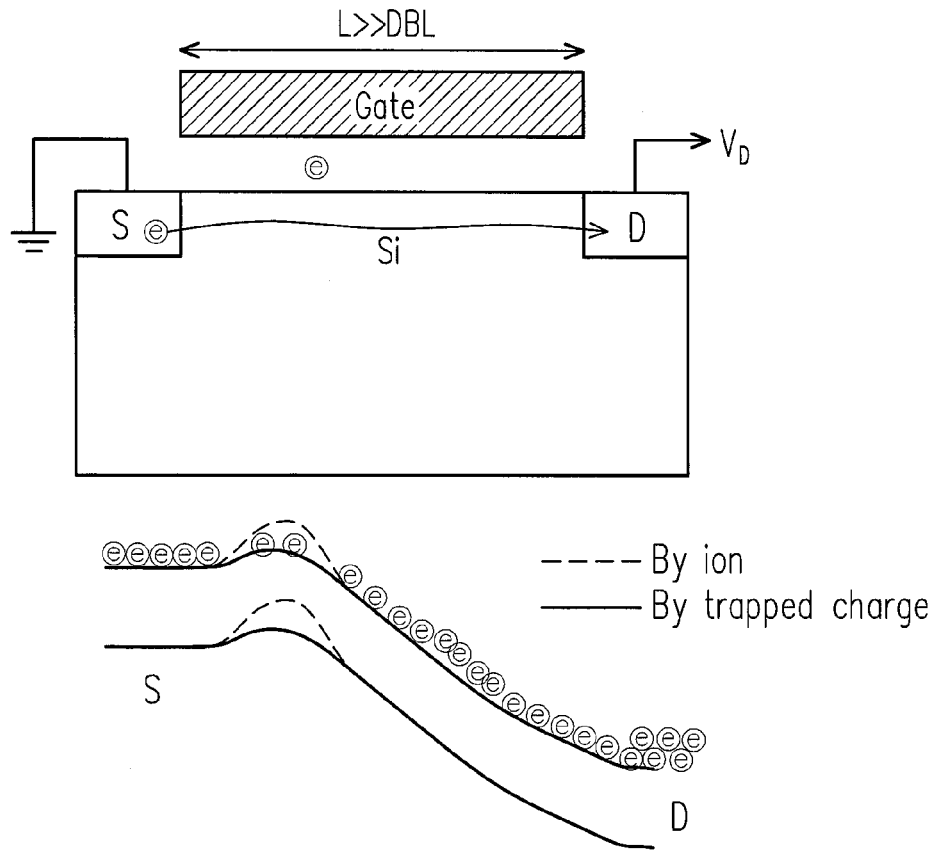
FIG. 22 illustrates the band diagram when an electron is trapped by an interface trap according to an exemplary embodiment.

In FIG. 22, an electron is trapped by an interface trap. Note that this trap is close to the interface but still in oxide. The pile up of peak barrier around the source edge is decreased as compared with the effect of an ion at the source edge inside the channel. The impact of this trap on the current transport through the channel is thereby smaller than that of an ion at the source side inside the channel, which is shown in FIG. 10.

Figure 23:
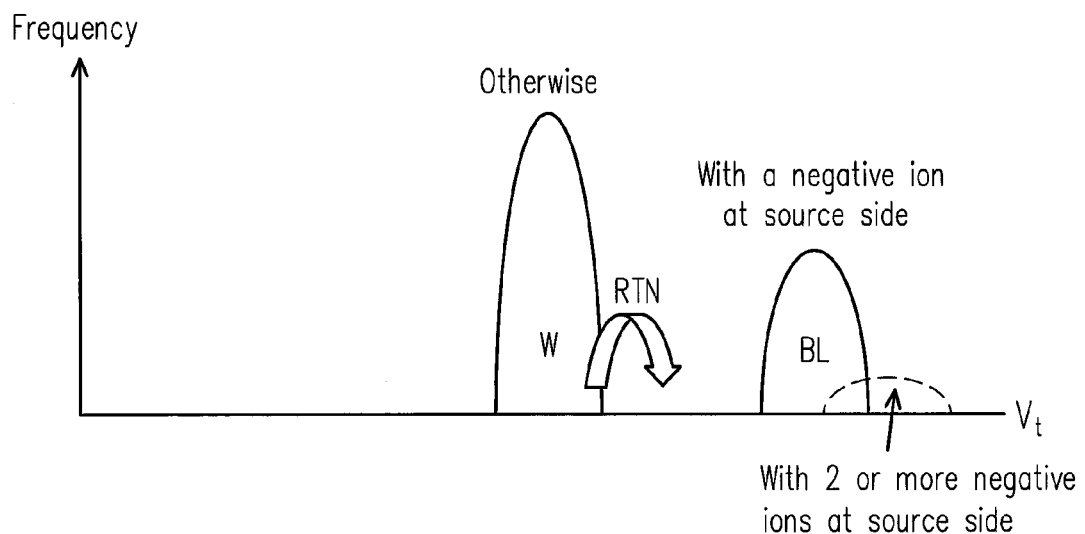
FIG. 23 illustrates a case where a cell transits from the peak of W to the gap window between W and BL due to the random-telegraph noise (RTN) according to an exemplary embodiment.

As illustrated in FIG. 23, it is possible that a cell transits from the peak of W to the gap window between the peak W and the peak BL, but it cannot transfer from the W peak to the BL peak directly because of the small amplitude of Vt shift that is attributable to the random-telegraph noise (RTN).

Figure 24:
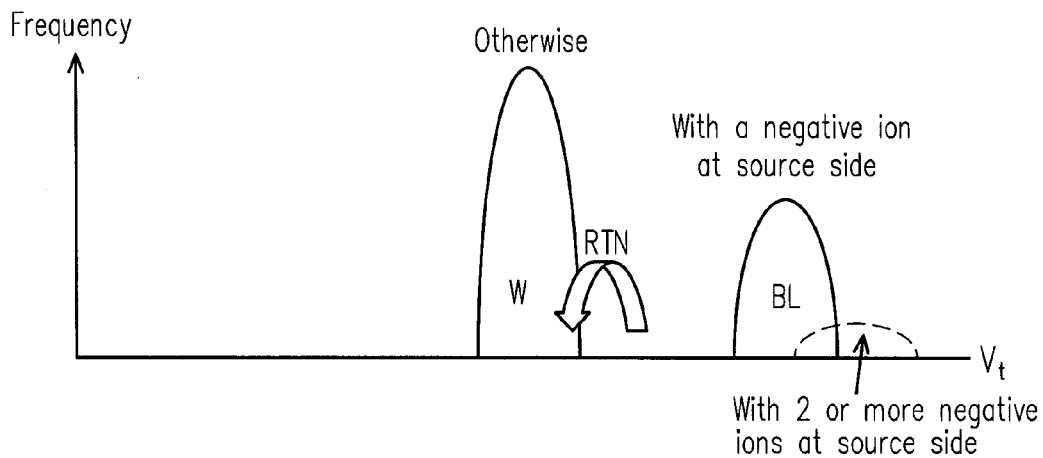
FIG. 24 illustrates a case where a cell transits from the gap window between W and BL to the peak of W owing to the random-telegraph noise (RTN) according to an exemplary embodiment.

As illustrated in FIG. 24, it is possible that a cell transits from the gap window between the W peak and the BL peak to the peak W owing to the random-telegraph noise (RTN). This can be regarded as the counter process of FIG. 23.

Figure 25:
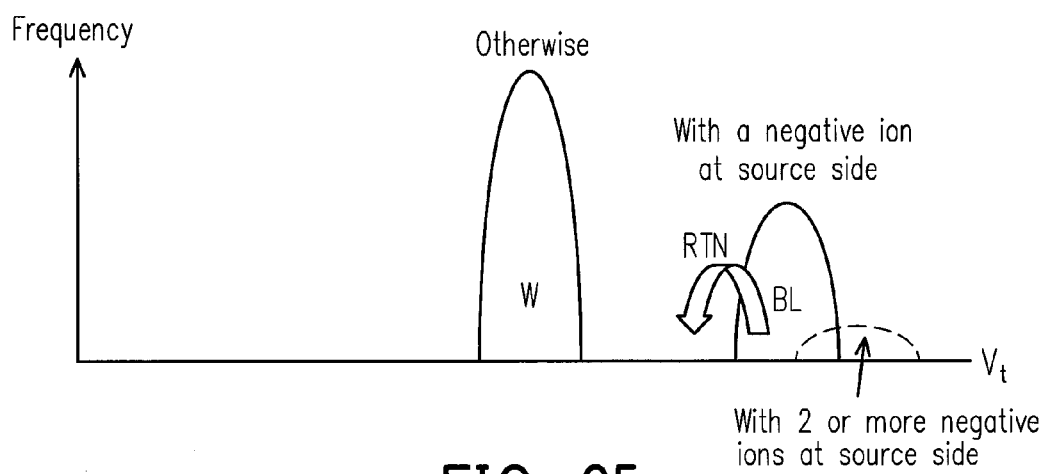
FIG. 25 illustrates a case where a cell transits from the peak of BL to the gap window between W and BL due to the random-telegraph noise (RTN) according to an exemplary embodiment.

As illustrated in FIG. 25, it is possible that a cell transits from the peak BL to the gap window between the peak W and the peak BL, but it cannot transfer from the BL peak to the peak W directly because of the small amplitude of Vt shift that is attributable to the random-telegraph noise (RTN).

Figure 26:
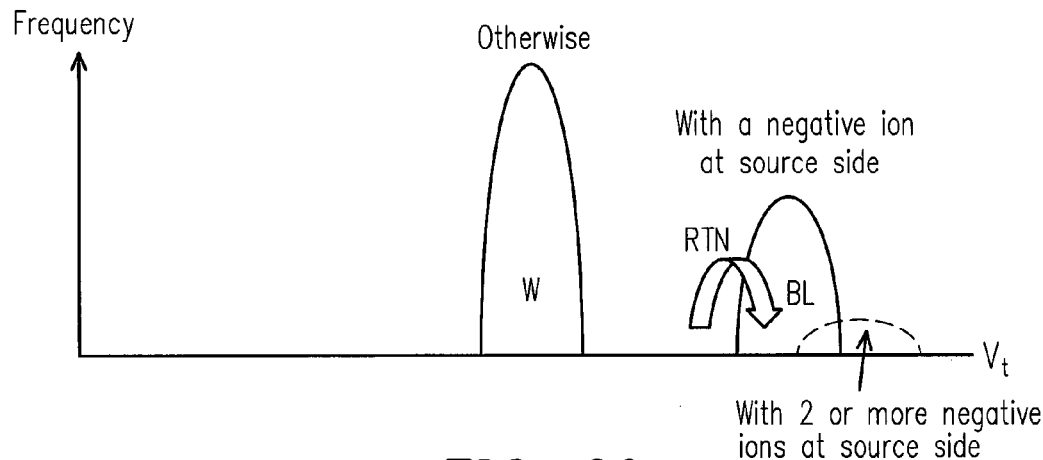
FIG. 26 illustrates a case where a cell transits from the gap window between W and BL to the peak of BL due to the random-telegraph noise (RTN) according to an exemplary embodiment.

As illustrated in FIG. 26, it is possible that a cell transits from the gap window between the peak W and the peak BL to the peak BL owing to the random-telegraph noise (RTN). This can be regarded as the counter process of FIG. 25.

Figure 27:
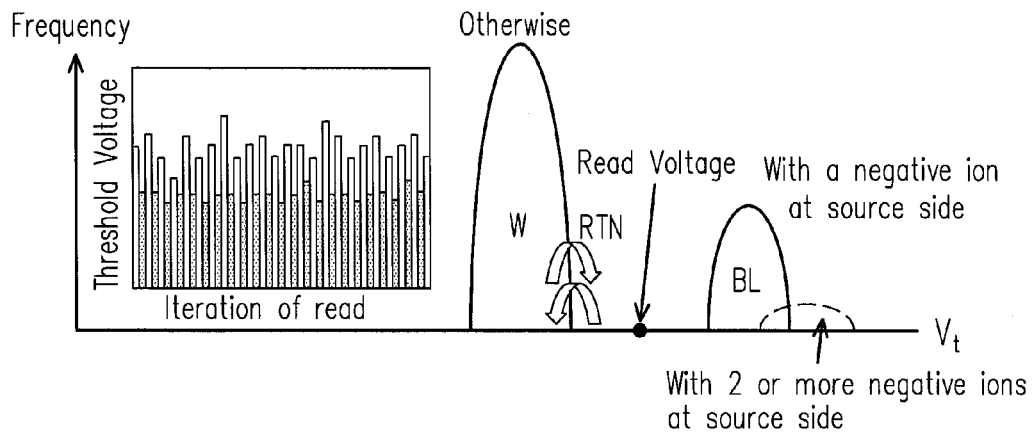
FIG. 27 illustrates a case where the Vt is changed from in W to a voltage in the gap window lower than the read voltage and returned toward W due to the RTN according to an exemplary embodiment.
Figure 28:
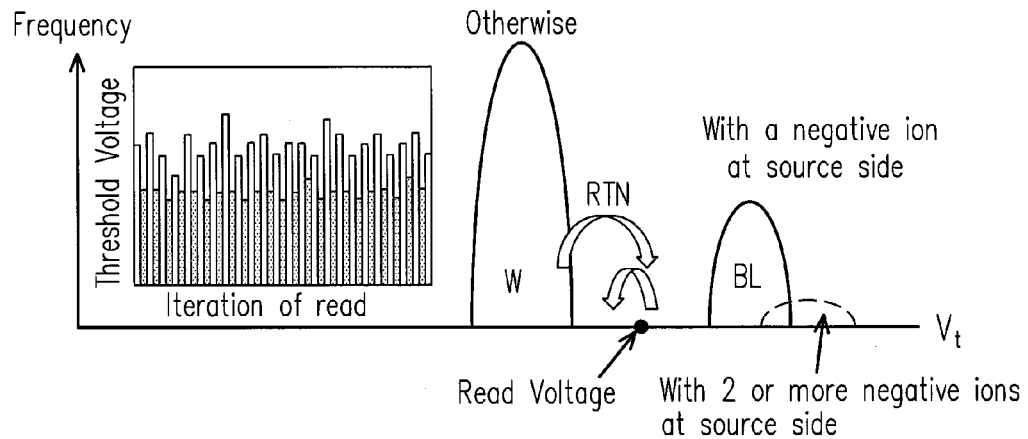
FIG. 28 illustrates a case where the Vt is changed from in W to a voltage in the gap window higher than the read voltage and returned toward W according to an exemplary embodiment.

Another significant feature of the RTN is that the Vt is repeatedly changed, as shown in FIGS. 27 and 28. FIG. 27 illustrates a case where the Vt is changed from inside the peak W to a voltage in the gap window lower than the read voltage and returned toward the peak W. It is noted that the amplitude of the return is generally different from the amplitude of the first Vt change. FIG. 28 illustrates a case where the Vt is changed from inside the peak W to a voltage in the gap window higher than the read voltage and returned toward the peak W. It is noted that the amplitude of the return is generally different from the amplitude of the first Vt change.

Figure 29:
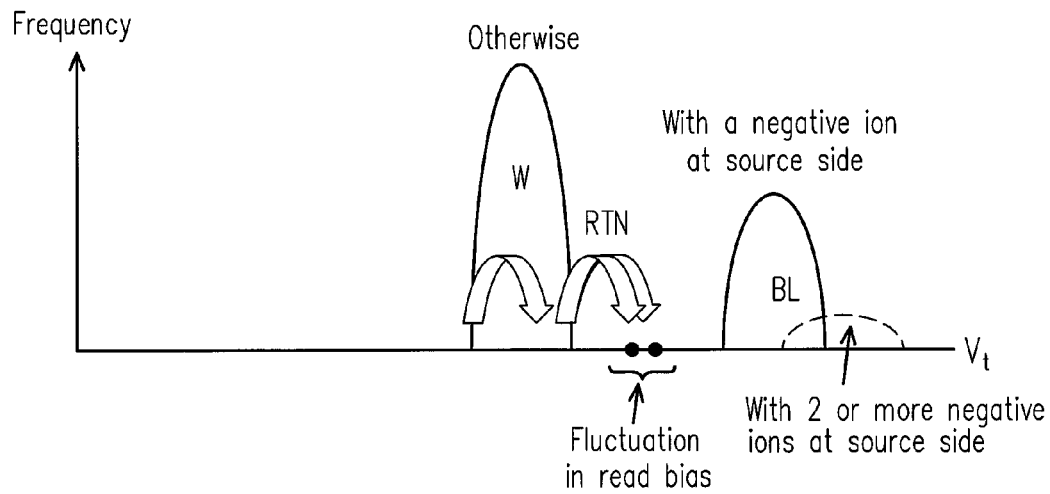
FIG. 29 illustrates several cases where Vt is changed from inside W toward the gap window according to an exemplary embodiment.
Figure 30:
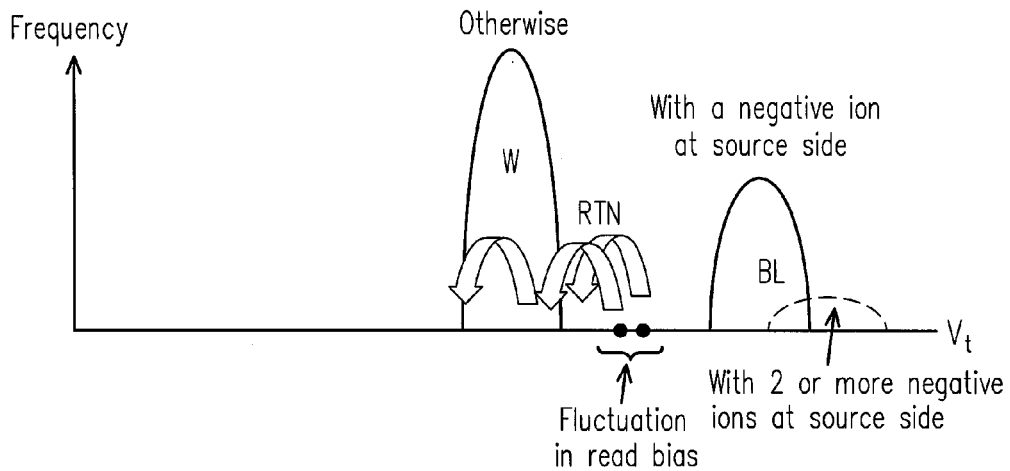
FIG. 30 illustrates several cases where Vt is changed from inside the gap window to W according to an exemplary embodiment.
Figure 31:
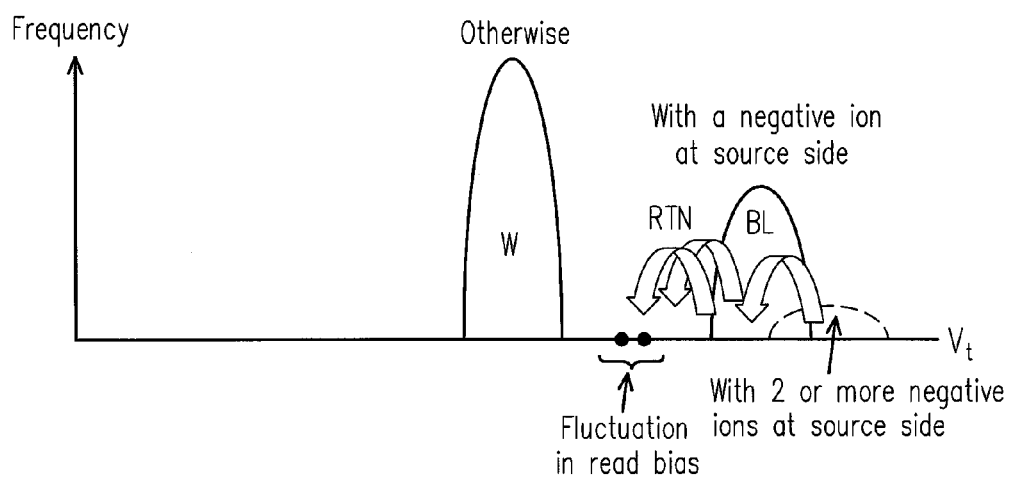
FIG. 31 illustrates several cases where Vt is changed from inside BL toward the gap window according to an exemplary embodiment.
Figure 32:
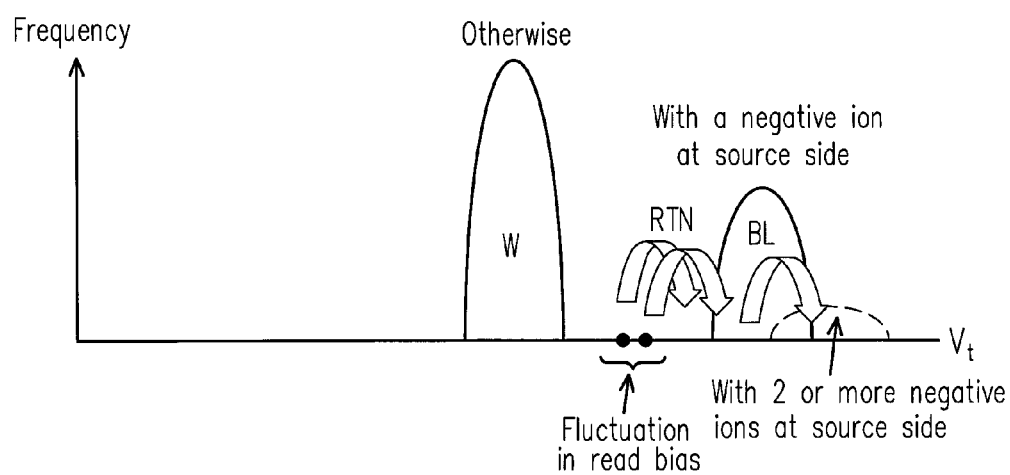
FIG. 32 illustrates several cases where Vt is changed from inside the gap window to BL according to an exemplary embodiment.

Moreover, FIG. 29 illustrates several cases where the Vt is changed from inside the peak W toward the gap window. The amplitude of Vt shift is different from each other in general. FIG. 30 illustrates several cases where the Vt is changed from inside the gap window to the peak W. FIG. 31 illustrates several cases where the Vt is changed from inside the peak BL toward the gap window. FIG. 32 illustrates several cases where the Vt is changed from inside the gap window to the peak BL. In the above figures (FIGS. 29-32), the amplitude of Vt shift is different from each other in general and the Vt shift by RTN is larger than the fluctuation of the read bias that is attributable to the lower sheet resistance of the common word line (WL).

Accordingly, the Vt fluctuations due to the random-telegraph noise are mitigated. In the invention, the essential idea for removing the impact of the random-telegraph noise (RTN) is by repeated readings of the threshold voltage. Since the Vt shift owing to the RTN is changed in every sensing, as shown in FIGS. 27 and 28, the repeated sensing can remove the impact of RTN. This repeated sensing procedure may be performed in all of the cell transistors.

Figure 33:
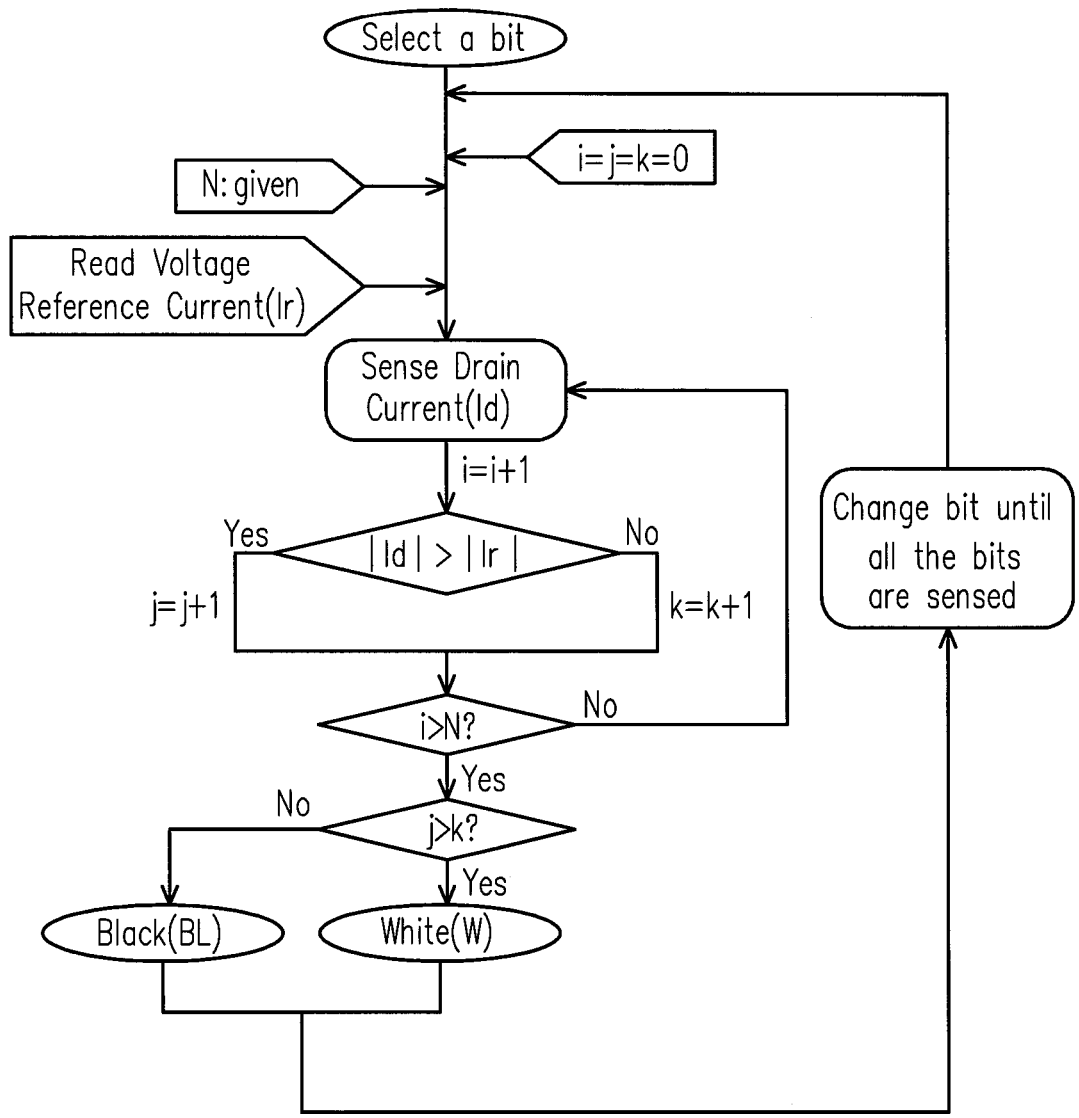
FIG. 33 illustrates the procedure of the iterative sensing of a cell transistor (bit) according to an embodiment of the invention.

The iterative sensing procedure of a cell transistor (bit) is illustrated in FIG. 33. Firstly, a cell transistor to be sensed is selected. Subsequently, the number (N) of the iteration of the serial sensing is given, wherein N is typically more than 10. The read voltage and the reference current (Ir) are also given. The read voltage may be higher than the right tail value of the peak W and lower than the left tail value of the peak BL, as illustrated in FIGS. 27-32. The reference current typically can be determined by considering the technology node, i.e., the channel length (L). The iteration counters, i, j and k, are all set to zero in the initial condition. Next, the drain current (Id) of the cell transistor (bit) illustrated is sensed, and the first iteration counter (i) is incremented by one, that is, i=i+1. Subsequently, the drain current (Id) is compared with the reference current (Ir). If the absolute value of Id is larger than that of Ir, the second iteration counter (j) is incremented by one. Otherwise, the third iteration counter (k) is incremented by one. Subsequently, the first iteration counter (i) and the number of the iteration of serial sensing (N) are compared. If i<N, the process is returned back to the sensing of drain current, and the first iteration counter (i) is incremented by one again. Otherwise, the second iteration counter (j) is compared with the third iteration counter (k). If j>k, the threshold voltage of the sensed cell belongs to the peak W (white) shown in FIGS. 14, 19, 20 and 23-32. Otherwise, the threshold voltage of the sensed cell belongs to the peak BL (black) shown in FIGS. 14, 19, 20 and 23-32. Thereafter, another cell transistor is selected, and then the above-mentioned procedure after the first step of selecting a cell transistor to be sensed is repeated until the entire cell transistors (bits) are iteratively sensed according to the above-mentioned procedure.

Fifth Embodiment: Expansion to RGB Board

Figure 34:
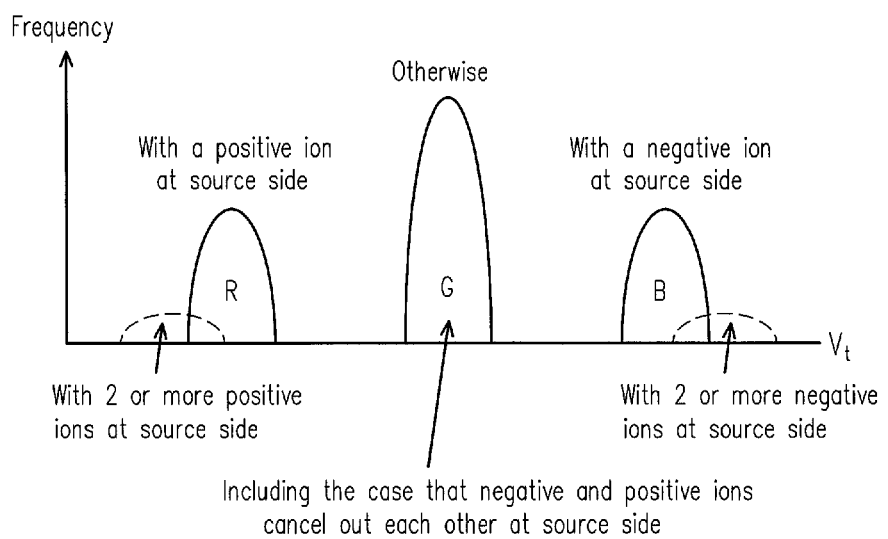
FIG. 34 illustrates a Vt distribution of the cells after the cells are subjected to random doping with negative and positive ions according to a fifth embodiment of the invention.
Figure 35:
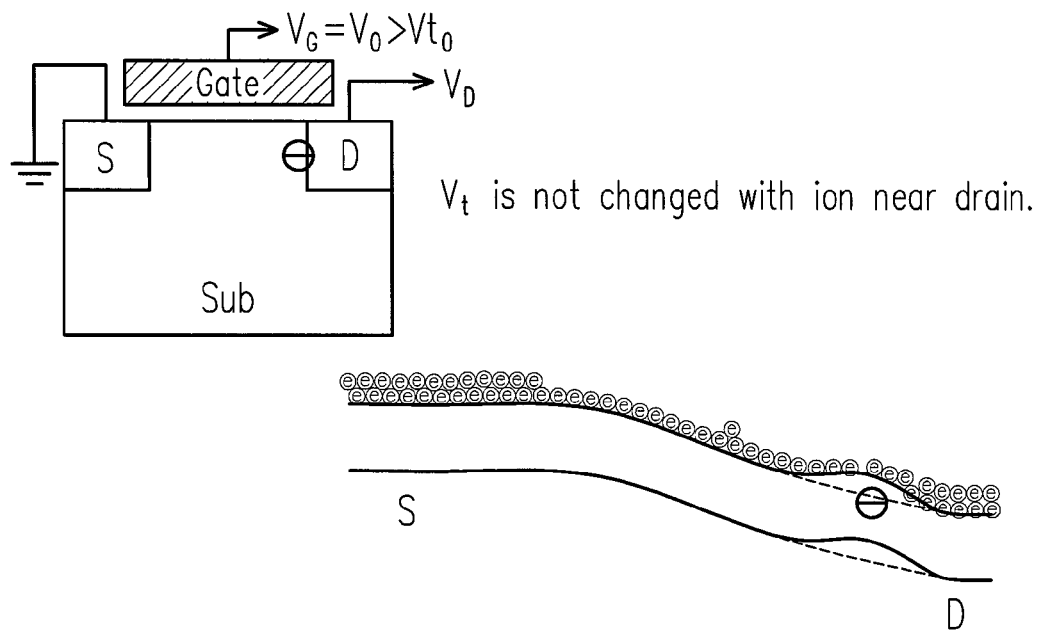
FIGS. 35, 36, 37 and 38 illustrate cases where positive or negative ions are far away from the source edge at the surface of the substrate according to an exemplary embodiment.
Figure 36:
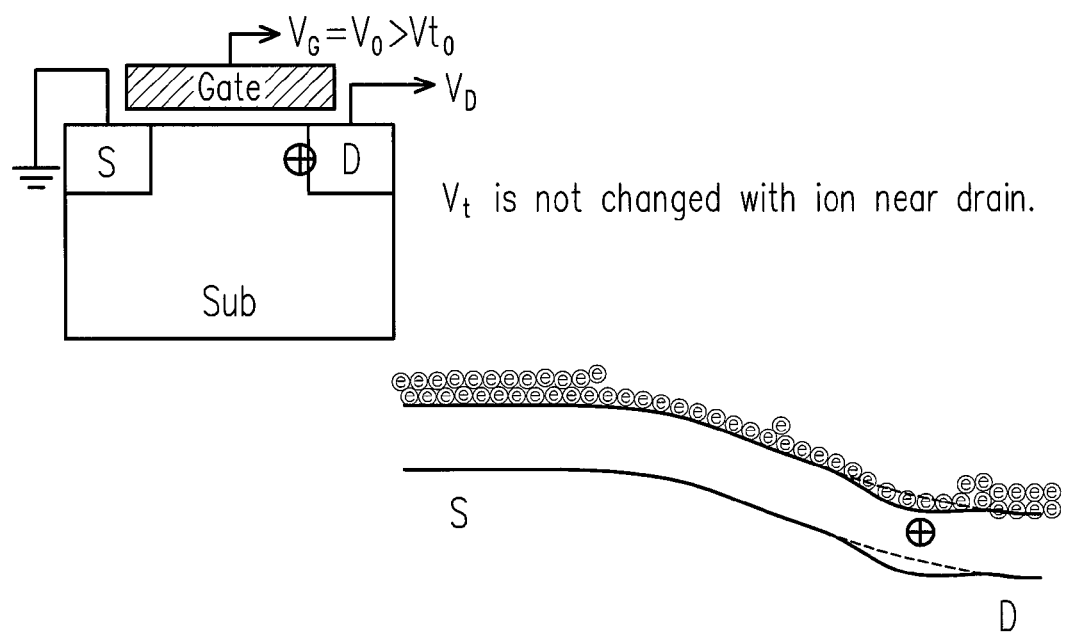
Figure 37:
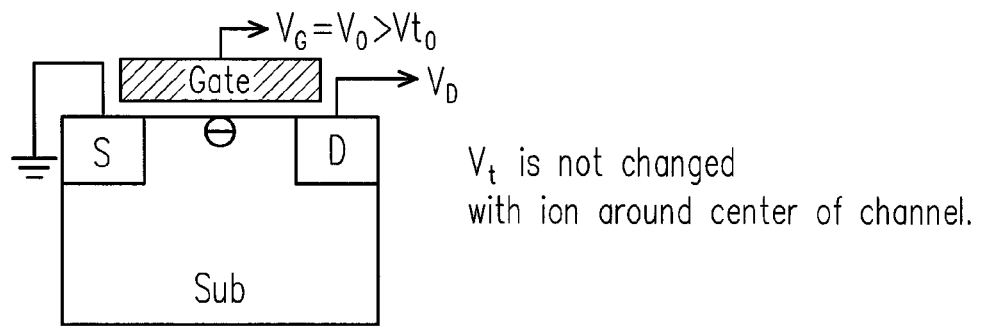
Figure 37:
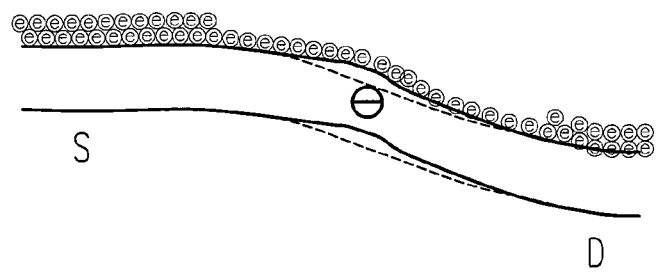
Figure 38:
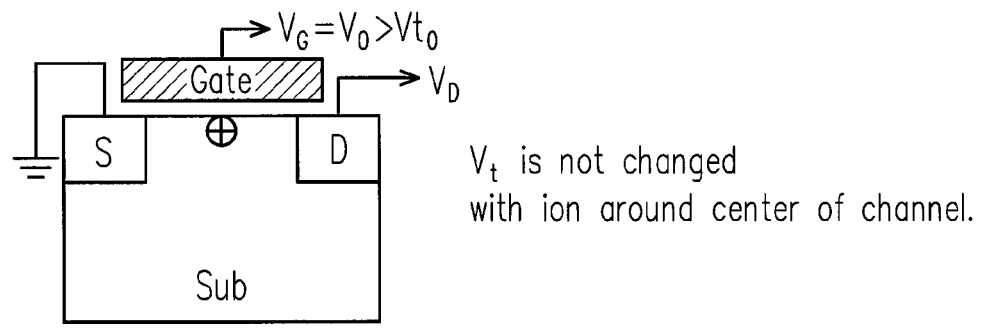
Figure 38:
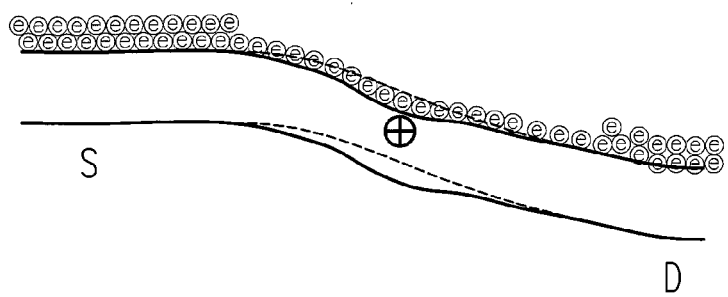
Figure 39:
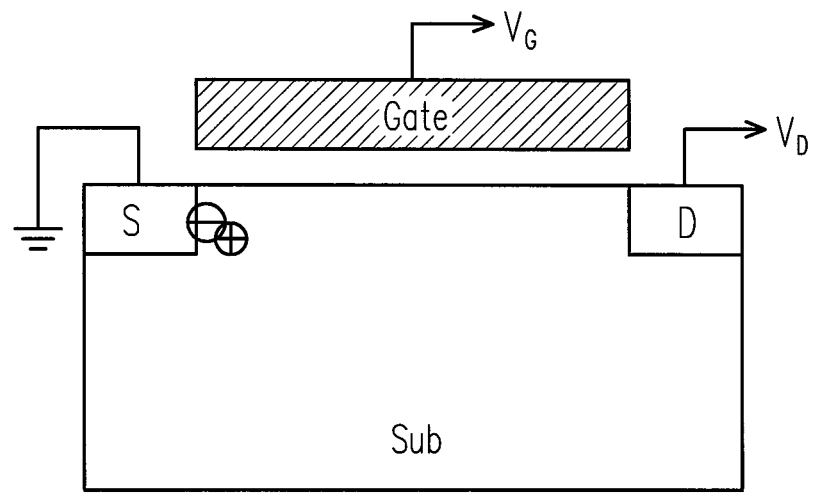
FIGS. 39 and 40 illustrate two cases where positive and negative ions are canceled out by each other even when the positive and negative ions are present at the source-channel interface according to an exemplary embodiment.
Figure 40:
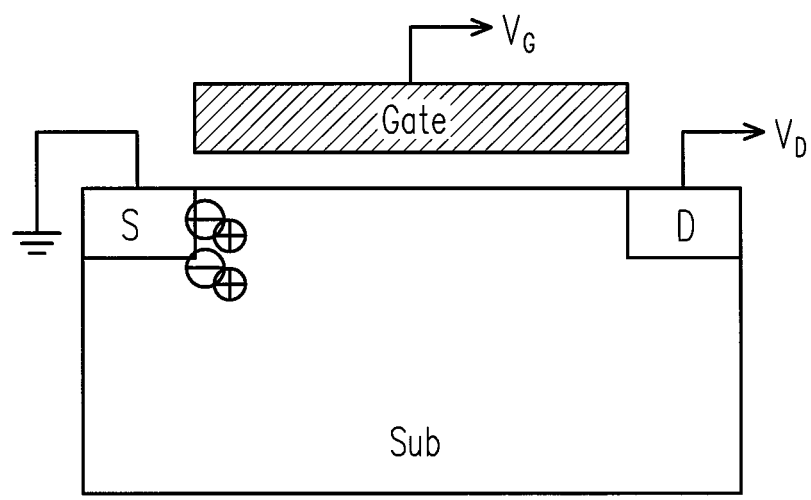

As mentioned above, a positive ion at the source edge can also change threshold voltage (Vt), as illustrated in FIG. 15, while the direction of the Vt shift becomes opposite to the Vt shift by a negative ion at the source edge. In the disclosure hereafter, the higher Vt peak in the Vt distribution (owing to a negative ion at the source edge) is re-designated as blue (B), which was the peak BL (black) in the previous embodiments. The lower Vt peak in the Vt distribution (owing to a positive ion at the source edge) is re-designated as red (R), and the other peak, which was the peak W (white) in the previous embodiments, is re-designated as green (G), as shown in FIG. 34. The peak R has a tail in the left owing to 2 or more positive ions at the source side. The peak B has a tail in the right owing to 2 or more negative ions at the source side. The peak G is made of the other cases, including the cases where a positive or negative ion is far away from the source edge at the surface of the substrate as illustrated in FIGS. 35, 36, 37 and 38, the cases with the RTN as illustrated in FIG. 22, and the cases that positive and negative ions are canceled out by each other even if they exist at the source edge at the surface of the substrate as illustrated in FIGS. 39 and 40. Using the same mapping method as illustrated in FIGS. 12 and 13, the RGB checker board pattern is obtained, as shown in FIG. 41. The RGB checker board pattern has a larger fluctuation on the checker board pattern than the white-black checker board pattern. This implies that the RGB checker board pattern may be preferable even when another doping process is added.

Sixth Embodiment: Measure to Random-Telegraph Noise in RGB-Type

Figure 42:
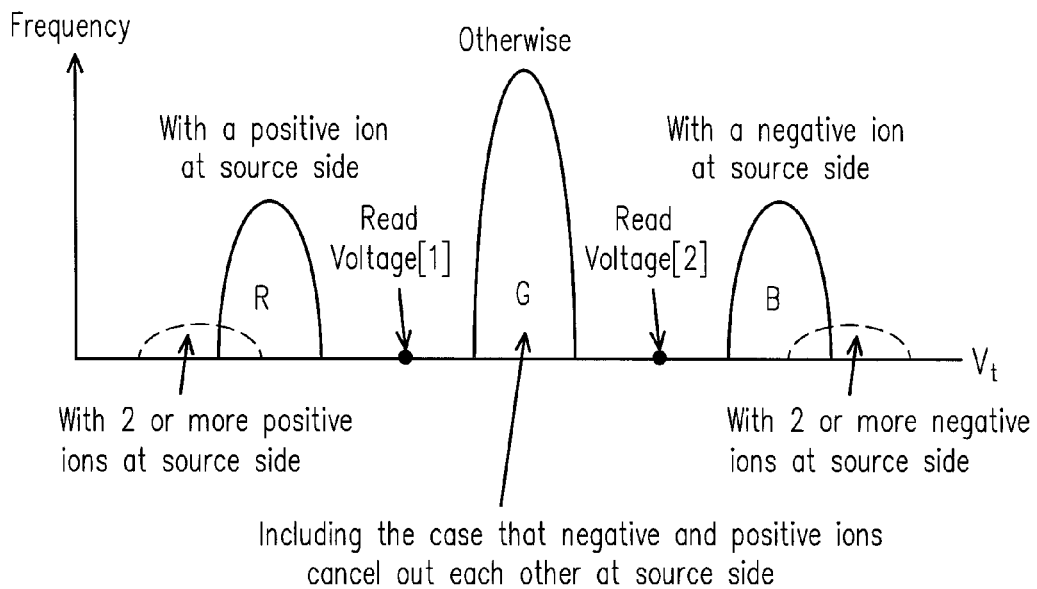
FIG. 42 illustrates the relationship between the Vt-distribution peaks R, G and B and the two read voltages (1) and (2) according to a sixth embodiment of the invention.

In order to distinguish R and G, a first read voltage (1) is applied, as illustrated in FIG. 42. It is noted that the read voltage (1) is in the gap window between peaks R and G. In order to distinguish G and B, a second read voltage (2) is applied, as illustrated in FIG. 42. It is noted that the second read voltage (2) is in the gap window between peaks G and B. If the first sense by the first read voltage (1) and the second sense by the second read voltage (2) return "R" and "G", respectively, this cell is labeled "R". If the first sense by the first read voltage (1) and the second sense by the second read voltage (2) return "G" and "G", respectively, this cell is labeled "G". If the first sense by the first read voltage (1) and the second sense by the second read voltage (2) return "G" and "B", respectively, this cell is labeled "B".

Figure 43:
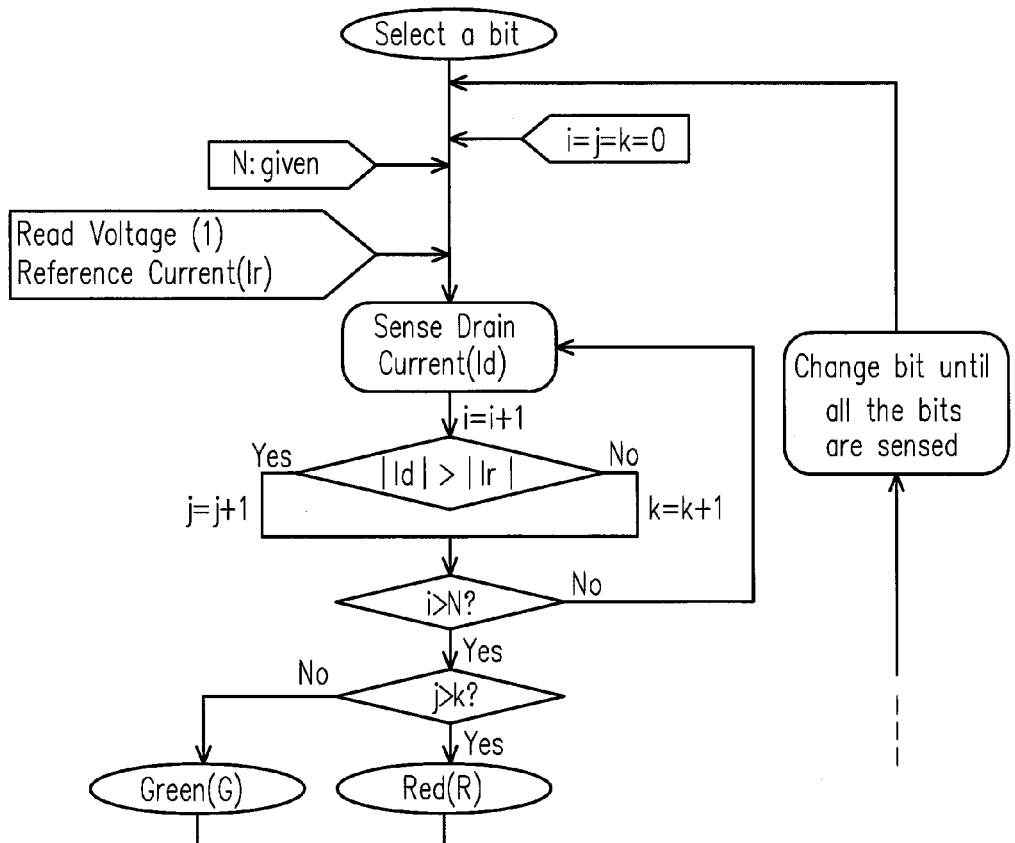
FIGS. 43 and 44 illustrate a method for removing the random-telegraph noise (RTN) according to the sixth embodiment of the invention.

The procedure of distinguishing R and G is illustrated in FIG. 43. Firstly, a cell transistor (bit) to be sensed is selected. Subsequently, the number (N) of the iteration of the serial sensing is given. The first read voltage (1) and the reference current (Ir) are also given. The first read voltage (1) may be higher than the right tail of the peak R and lower than the left tail of the peak G, as illustrated in FIG. 40. The reference current typically can be determined by the technology node, i.e., the channel length (L). The iteration counters, i, j and k, are all set to zero in the initial condition. Next, the drain current (Id) is sensed and the first iteration counter (i) is incremented by one, that is, i=i+1. Subsequently, the drain current (Id) is compared with the reference current (Ir). If the absolute value of Id is larger than that of Ir, the second iteration counter (j) is incremented by one. Otherwise, the third iteration counter (k) is incremented by one. Subsequently, the first iteration counter (i) and N are compared. If i<N, then the process is returned back to the step of sensing the drain current, and the first iteration counter (i) is incremented by one again. Otherwise, the second iteration counter (j) is compared with the third iteration counter (k). If j>k, the threshold voltage of the sensed cell belongs to the red peak (R), as shown in FIGS. 38 and 42. Otherwise, the threshold voltage of the sensed cell belongs to the green peak (G) shown in FIGS. 38 and 42.

Figure 44:
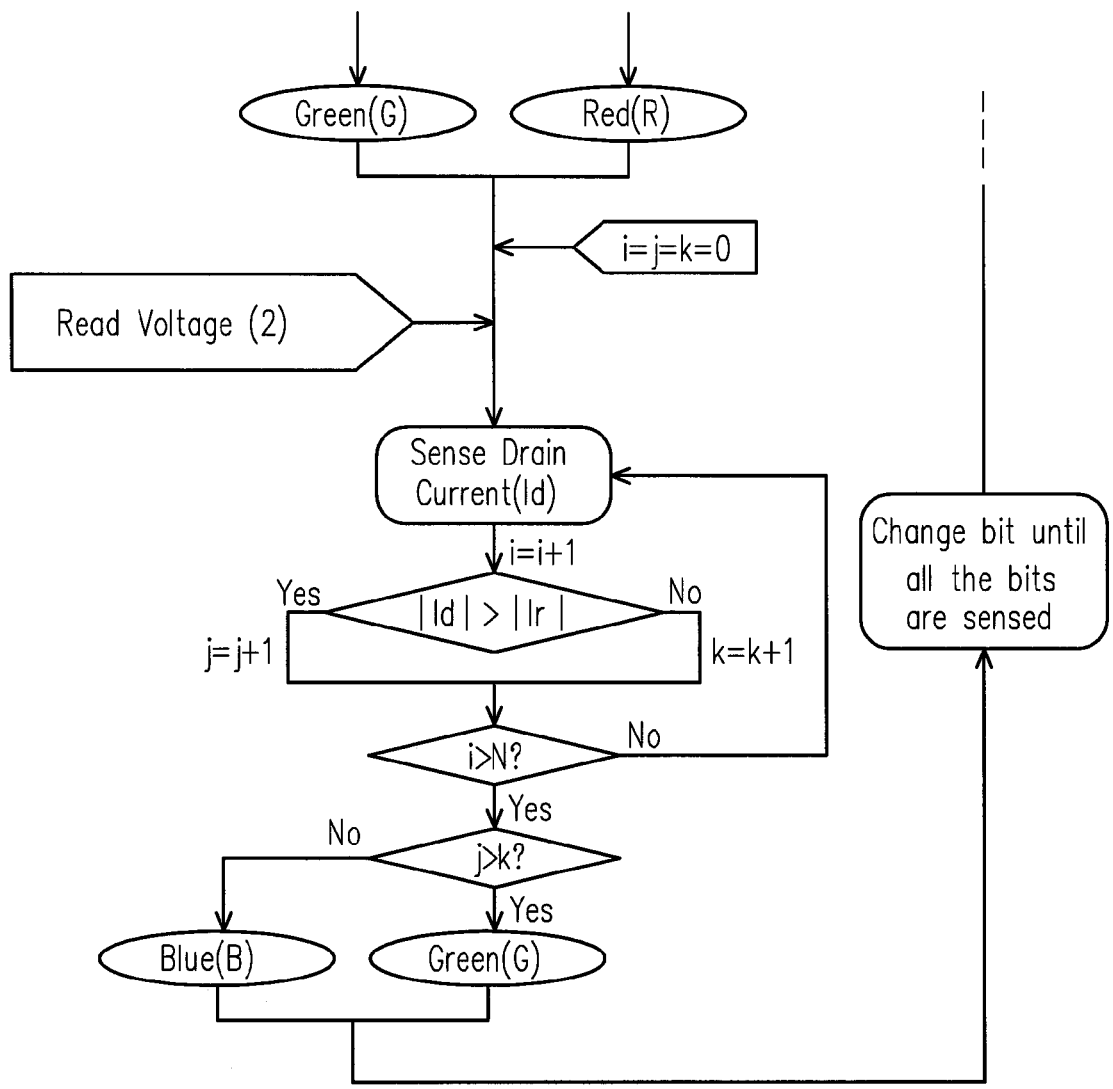

The subsequent procedure of distinguishing G and B is illustrated in FIG. 44. Firstly, a cell transistor (bit) to be sensed is selected. Subsequently, the number (N) of the iteration of the serial sensing is given. The read voltage and the reference current (Ir) are also given. The second read voltage (2) may be higher than the right tail of the peak G and lower than the left tail of the peak B, as illustrated in FIG. 40. The iteration counters, i, j and k, are all set to zero in the initial condition. Next, the drain current (Id) is sensed, and the first iteration counter (i) is incremented by one, that is, i=i+1. Subsequently, the drain current (Id) is compared with the reference current (Ir). If the absolute value of Id is larger than that of Ir, the second iteration counter (j) is incremented by one. Otherwise, the third iteration counter (k) is incremented by one. Subsequently, the first iteration counter (i) and N are compared. If i<N, the process is returned back to the step of sensing the drain current, and the first iteration counter (i) is incremented by one again. Otherwise, the second iteration counter (j) is compared with the third iteration counter (k). If j>k, the threshold voltage of the sensed cell belongs to the green peak (G), as shown in FIGS. 38 and 42. Otherwise, the threshold voltage of the sensed cell belongs to the blue peak (B) shown in FIGS. 38 and 42.

According to the afore-mentioned procedures, if the first sense by the first read voltage (1) and the second sense by the second read voltage (2) return "R" and "G", respectively, the cell is labeled "R". If the first sense by the first read voltage (1) and the second sense by the second read voltage (2) return "G" and "G", respectively, the cell is labeled "G". If the first sense by the first read voltage (1) and the second sense by the second read voltage (2) return "G" and "B", respectively, the cell is labeled "B". Similarly, it can be deduced that:

If R→G, then return R.
If G→G, then return G.
If G→B, then return B.

Thereafter, another cell transistor is selected, and then the above-mentioned procedure after the first step of selecting a cell to be sensed is repeated until all the cell transistors (bits) are iteratively sensed according to the above-mentioned procedure, as illustrated in FIGS. 43 and 44.

Seventh Embodiment: Fin-FET Cell

In the above embodiments, Fin-FET type cells are used in order to make the channel length comparative to the de Broglie length (DBL), although other embodiments of the invention are not limited thereto.

Eighth Embodiment: Nano-Wire Cell

Figure 45:
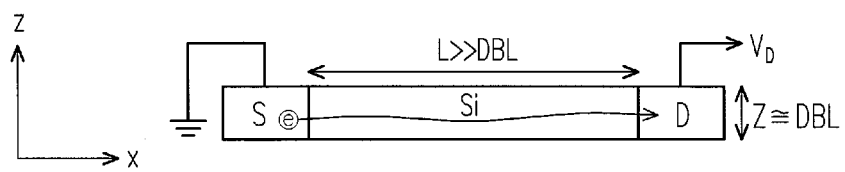
FIG. 45 schematically illustrates the structure of a nano-wire FET-type cell useful in the invention and a drain current of the same, according to an eighth embodiment of the invention.
Figure 46:
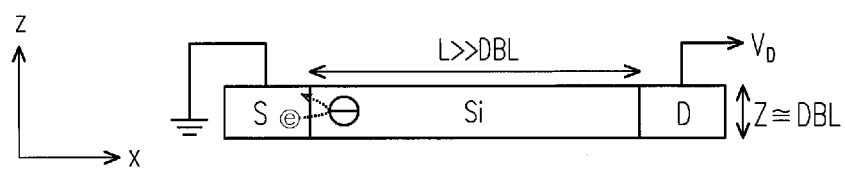
FIG. 46 illustrates a conduction state of the nano-wire FET-type cell when a negative ion is present at the source-channel interface according to an exemplary embodiment.

Next, use of nano-wire FET type cells in the semiconductor device system of the exemplary embodiment of the invention is described below, as illustrated in FIGS. 45 and 46. The cross-sectional view in XY plane is the same as in FIGS. 9 and 10, in which the channel width (W) is comparative to the de Broglie length (DBL).

FIG. 45 illustrates when no ion exists in the channel between the source (S) and the drain (D). The channel length is larger than the DBL, while the channel width (W) and the thickness of the channel silicon layer (Z) are comparative to the DBL.

When a negative ion exists at the source edge in the channel, as illustrated in FIG. 46, an electron current is reflected by the ion because of no detour, which is similar to the illustration of FIG. 10.

Since ions cannot exist deep in the vertical direction because of the thin nano-wire, the influence of the ion at the source end of the channel is more frequent.

Figure 48:
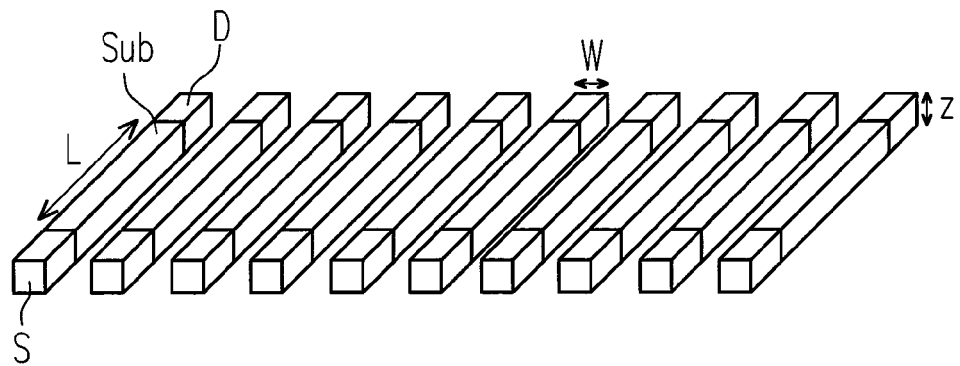
FIG. 48 illustrates a bird's view of a nano-wire array for constituting a nano-wire FET-type cell array according to an exemplary embodiment.

Similarly, it is possible to gather a plurality of nano-wires each of which includes a source (S), a drain (D), and a channel between the source and the drain, as illustrated in FIG. 48. It is noted that the channel width (W) and the silicon channel-layer thickness (Z) are comparative to the de Broglie length (DBL), while the channel length (L) is much longer than de Broglie length (DBL).

Figure 47:
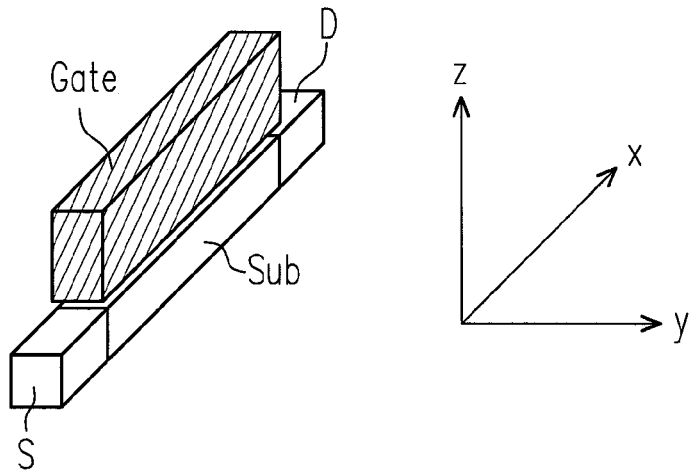
FIG. 47 illustrates a bird's view of a nano-wire FET-type cell according to an exemplary embodiment.
Figure 49:
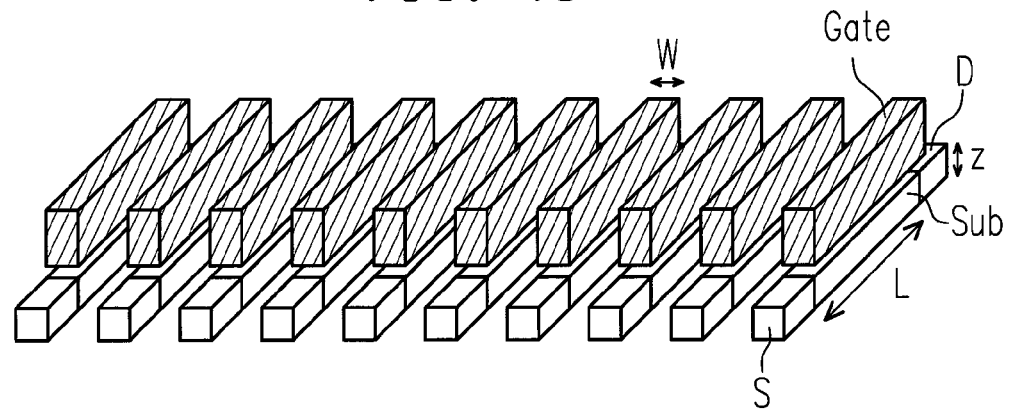
FIG. 49 illustrates a bird's view of the nano-wire FET-type cell array according to an exemplary embodiment.
Figure 50:
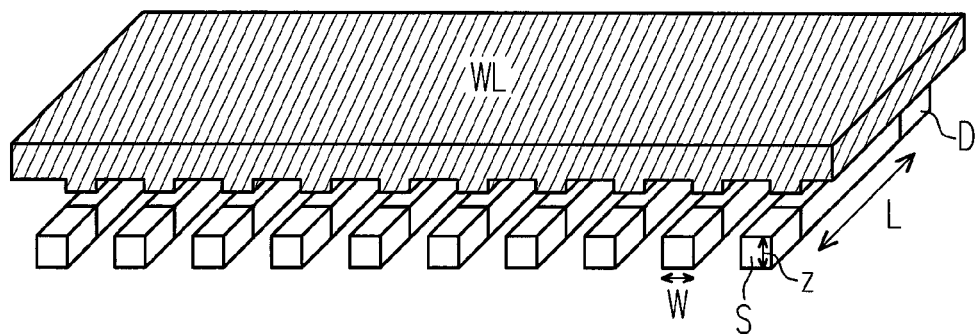
FIG. 50 illustrates a case where all of the gates of the nano-wire FET-type cells are connected to a sheet-type common word-line (WL) according to an exemplary embodiment.
Figure 51:
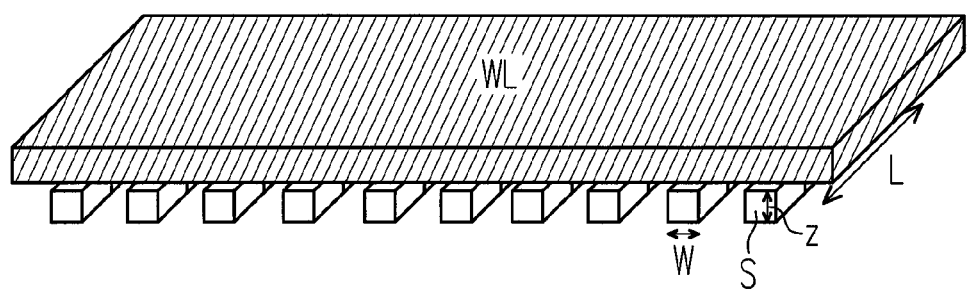
FIG. 51 illustrates a case where the gates of the nano-wire FET-type cells are replaced by a sheet-type common word-line (WL) according to an exemplary embodiment.

Similarly, gates can be appended to these nano-wires, as illustrated in FIG. 49. The unit cell transistor is illustrated in FIG. 47. In order to configure the network of wiring, which is shown in FIG. 11, all of the gates should be common. There may be gate insulating film between gate and channel. This is used as a component in the structures of FIGS. 50 and 51. In FIG. 50, a sheet-shaped common word line (WL) is connected to all of the gates. In FIG. 51, all of the gates are replaced by a sheet-shaped common word line (WL).

Ninth Embodiment: Tri-Gate Nano-Wire Cell

Figure 52:
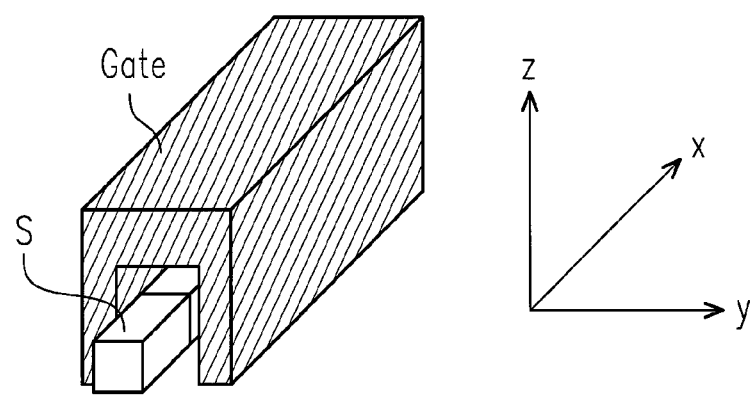
FIG. 52 illustrates a bird's view of a tri-gate nano-wire unit cell according to ninth embodiment of the invention.
Figure 53:
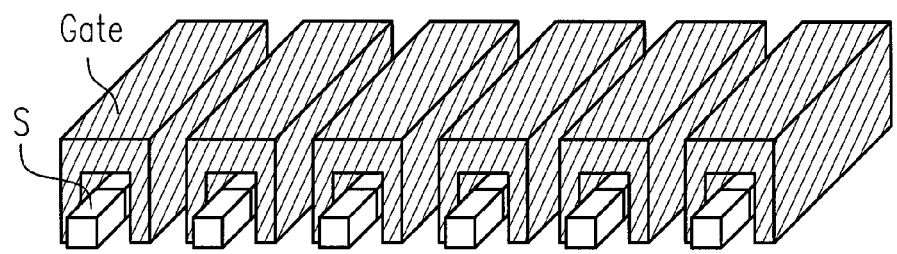
FIG. 53 illustrates an array of the tri-gate nano-wire cells of FIG. 52.
Figure 54:
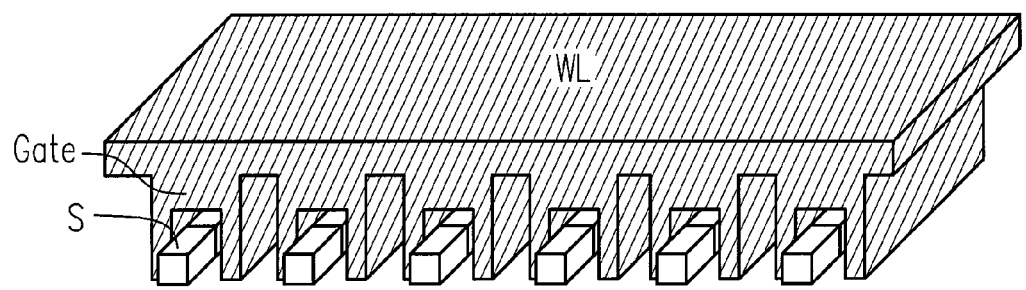
FIG. 54 illustrates a case where all of the gates of the tri-gate nano-wire cells are connected to a sheet-type common word-line (WL) according to an exemplary embodiment.
Figure 55:
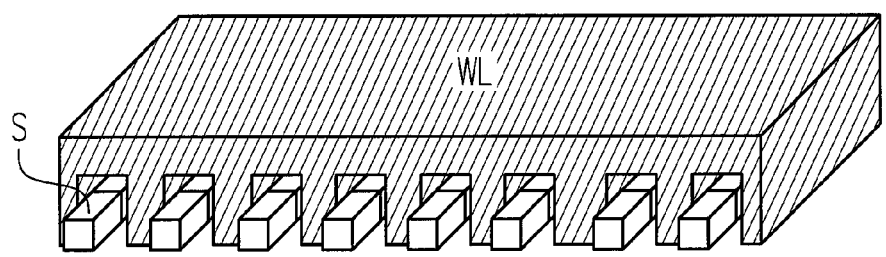
FIG. 55 illustrates a case where the gates of the tri-gate nano-wire cells are replaced by a sheet-type common word-line (WL) according to an exemplary embodiment.
Figure 56:
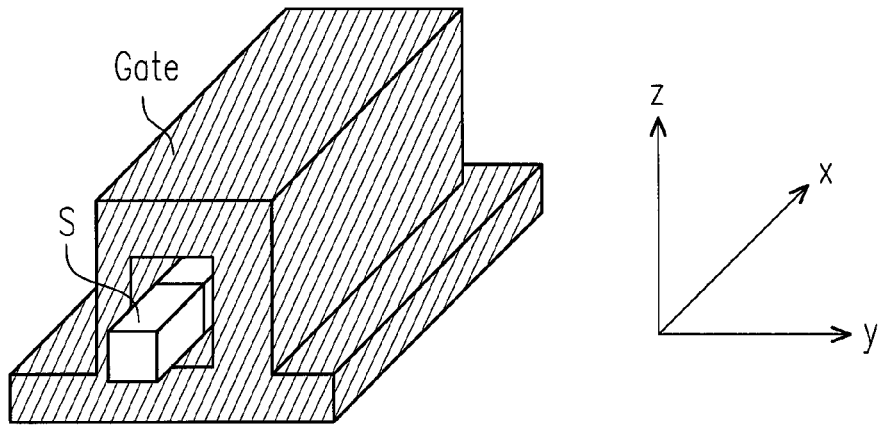
FIG. 56 illustrates a bird's view of a surrounding-gate nano-wire cell according to an exemplary embodiment.
Figure 57:
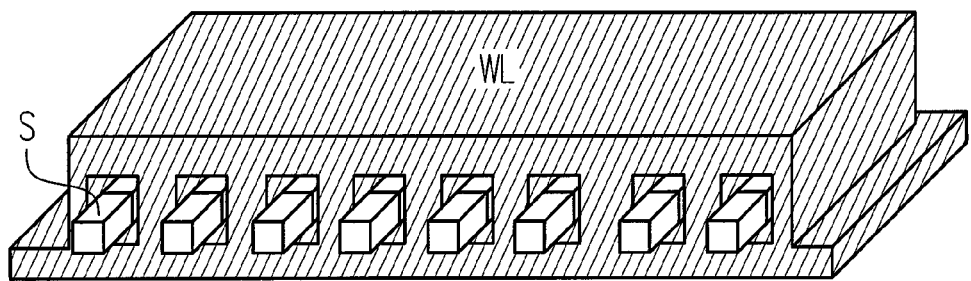
FIG. 57 illustrates an array of the surrounding-gate nano-wire cells of FIG. 56.

The unit cell transistor of tri-gate nano-wire cells is illustrated in FIG. 52. Gate insulating film that covers the nano-wire is covered by the gate. FIG. 53 illustrates an array of tri-gate nano-wire cells. In order to make the network of wiring, which may be as illustrated in FIG. 11, all of the gates should be common. This is realized in the structures illustrated in FIGS. 54 and 55. In FIG. 54, a sheet-shaped common word line (WL) is connected with all of the gates. In FIG. 55, all of the gates are replaced by a sheet-shaped common word line (WL). Furthermore, it is possible to cover the other plane of the cells with another sheet-shaped conductor, as shown in FIG. 57. It is preferred that the sheet-shaped conductor mentioned here is a thin-film of polysilicon. The unit cell transistor is illustrated in FIG. 56. The gate insulating film that surrounds the nano-wire is surrounded by the gate.

It should be noted that the fabrication process of cells like these is suitable to three-dimensional (3D) integration with nano-wire channel and wire-all-around common word line. Thereby, a device-level chip identification can also be proposed in a manner compatible to 3D LSI.

Tenth Embodiment: Pillar-Type Cell

Figure 58:
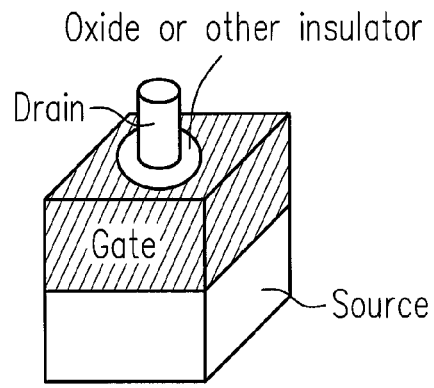
FIG. 58 illustrates a bird's view of a pillar-type cell according to an exemplary embodiment.
Figure 59:
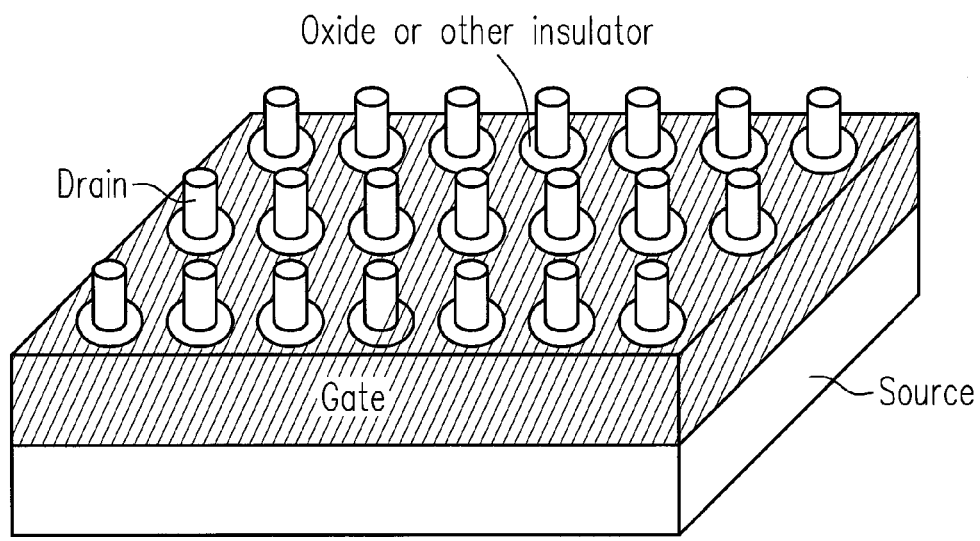
FIG. 59 illustrates an array of the pillar-type cell as shown in FIG. 58 according to an exemplary embodiment.
Figure 60:
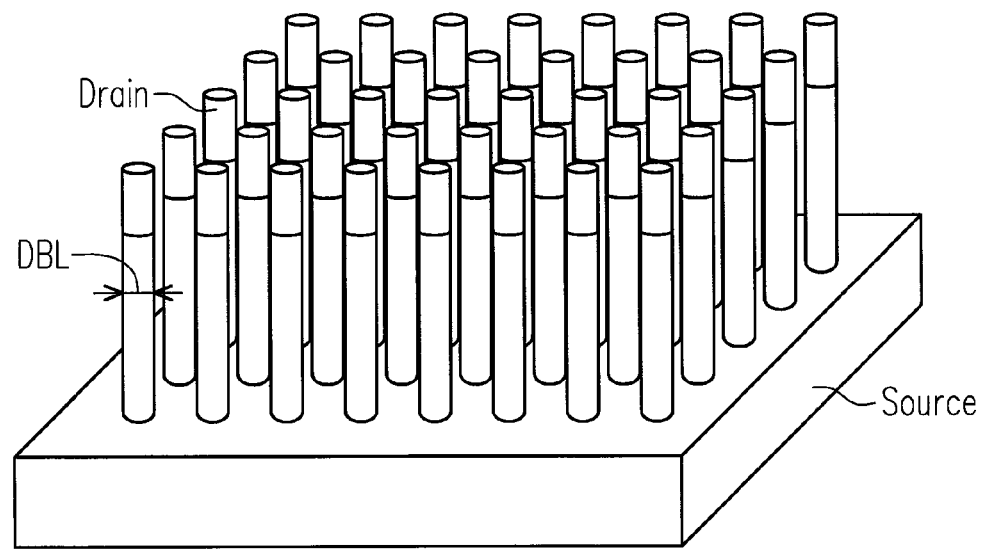
FIG. 60 illustrates a structure of the pillar-type cell array excluding the gates according to an exemplary embodiment.

The above-mentioned nano-wire cells may be replaced by pillar-type cells, as illustrated in FIG. 58. The pillar is surrounded by gate insulating film that is further surrounded by the gate. A corresponding cell array is illustrated in FIG. 59. It is noted that there is a common word line (WL) which makes a gate-all-around structure of each cell (pillar). FIG. 60 illustrates the structure of this exemplary embodiment excluding the common word line (WL). The diameter of the pillar should be comparative to the DBL. The source is the substrate to which all the pillars end, and is thereby common to all the cells (pillars). The other end of each pillar is the drain of the cell. There is channel between the source and the drain in each pillar, and further the channel length should be larger than the DBL. The fabrication process of cells like this is suitable to 3D integration with pillar-type channel and a sheet-shaped common word line. Thereby, a device-level chip identification can be also proposed in a manner compatible to three-dimensional LSI.

It is preferable that the channel length mentioned above is long enough to make the drain current stable when no ion exists at the source edge in the channel. Typically, the channel length is more than three times the DBL; i.e., 30 nm.

The invention has been disclosed above in the preferred embodiments, but is not limited to those. It is known to persons skilled in the art that some modifications and innovations may be made without departing from the spirit and scope of the invention. Hence, the scope of the invention should be defined by the following claims.

What is claimed is:

1. An integrated circuit, comprising:
   at least one first input/output end;
   at least one current path, connected with the first input/output end;
   at least one control end, disposed above the at least one current path, configured to apply a plurality of control end voltages on the at least one current path; and
   at least one second input/output end, connected with the current path;
   at least one sense-amplifier, connected with the at least one second input/output end, configured to sense a plurality of threshold voltages corresponding to the at least one control end; and
   a processing circuit, configured to categorize each of the threshold voltages into a plurality of states,
   wherein, the width and the thickness of the current path are defined according to the de Broglie length (DBL), and the length of the current path is longer than the width and the thickness of the current path,
   wherein the width and the thickness of the current path are no higher than 10 nm.

2. The integrated circuit of claim 1, wherein at least one dopant ion is randomly doped in the at least one current path and near the interface of the at least one first input/output end and the at least one current path.

3. The integrated circuit of claim 2, wherein the at least one dopant ion is a negative ion.

4. The integrated circuit of claim 2, wherein the at least one dopant ion is a positive ion.

5. The integrated circuit of claim 1, wherein the length of the current path is at least three times longer than the width and the thickness of the current path.

6. The integrated circuit of claim 1,
   wherein the at least one sense-amplifier senses an electric current from the at least one second input/output end and identify the threshold voltage according to one of the control end voltages,
   wherein the processing circuit categorizes each threshold voltages identified by the corresponding sense-amplifiers into a first state and a second state and marks the state of each threshold voltages at an address in a mapping table.

7. The integrated circuit of claim 1, wherein the at least one control end further covers the at least one current path.

8. The integrated circuit of claim 1, wherein the at least one first input/output end, the at least one current path and the at least one second input/output end form a nano-wire, and the at least one control end further surrounds the nano-wire.

9. The integrated circuit of claim 1, wherein the processing circuit records states of the threshold voltages in a mapping table, such that the mapping table fluctuates with respect to random-dopant fluctuation of the integrated circuit.

10. An integrated circuit, comprising:
   at least one first input/output end;
   at least one current path, connected with the first input/output end;
   at least one control end, disposed above the at least one current path, configured to apply a plurality of control end voltages on the at least one current path;
   at least one second input/output end, connected with the current path;
   at least one sense-amplifier, connected with the at least one second input/output end, configured to sense an electric current from the at least one second input/output end and identify a threshold voltage according to one of the control end voltages; and
   a processing circuit, configured to categorize each threshold voltages identified by the corresponding sense-amplifiers into a first state and a second state and mark the state of each threshold voltages at an address in a mapping table; and
   wherein at least one current adjusting element is disposed in the at least one current path to adjust an electrical current,
   wherein the at least one current adjusting element comprises at least one dopant ion, and at least either the width or the thickness of the current path are defined according to the de Broglie length (DBL), and the length of the current path is longer than the width of the current path,
   wherein the width and the thickness of the current path are no higher than 10 nm.

\* \* \* \* \*